United States Patent
Lee et al.

(10) Patent No.: US 10,593,801 B2
(45) Date of Patent: Mar. 17, 2020

(54) SEMICONDUCTOR DEVICES AND METHODS OF FABRICATING THE SAME

(71) Applicants: Tae-Jong Lee, Hwaseong-si (KR); Sanghyuk Hong, Yongin-si (KR); TaeYong Kwon, Suwon-si (KR); Sunjung Kim, Suwon-si (KR); Cheol Kim, Hwaseong-si (KR)

(72) Inventors: Tae-Jong Lee, Hwaseong-si (KR); Sanghyuk Hong, Yongin-si (KR); TaeYong Kwon, Suwon-si (KR); Sunjung Kim, Suwon-si (KR); Cheol Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 15/062,553

(22) Filed: Mar. 7, 2016

(65) Prior Publication Data
US 2016/0300949 A1    Oct. 13, 2016

(30) Foreign Application Priority Data

Apr. 10, 2015   (KR) .................. 10-2015-0050556
Jun. 23, 2015   (KR) .................. 10-2015-0088937

(51) Int. Cl.
*H01L 29/78*    (2006.01)
*H01L 29/08*    (2006.01)
(Continued)

(52) U.S. Cl.
CPC .. *H01L 29/7848* (2013.01); *H01L 21/823807* (2013.01); *H01L 21/823821* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/66636* (2013.01); *H01L 29/66795* (2013.01); *H01L 21/823814* (2013.01); *H01L 21/823878* (2013.01)

(58) Field of Classification Search
CPC ......... H01L 21/823807; H01L 29/7848; H01L 29/165; H01L 29/6681; H01L 29/66818; H01L 21/823821; H01L 21/82381; H01L 29/66803

See application file for complete search history.

(56) References Cited

U.S. PATENT DOCUMENTS 6,093,611 A *  7/2000  Gardner ............ H01L 21/76224
                                                257/E21.546
6,872,647 B1   3/2005  Yu et al.
(Continued)

FOREIGN PATENT DOCUMENTS

KR   20140072769   6/2014
KR   20140101505   8/2014

*Primary Examiner* — Alexander G Ghyka
*Assistant Examiner* — S M Sohel Imtiaz
(74) *Attorney, Agent, or Firm* — Myers Bigel, P.A.

(57) ABSTRACT

Semiconductor devices and methods of fabricating the same are provided. The methods of fabricating the semiconductor devices may include providing a substrate including an active pattern protruding from the substrate, forming a first liner layer and a field isolating pattern on the substrate to cover a lower portion of the active pattern, forming a second liner layer on an upper portion of the active pattern and the field isolation pattern, and forming a dummy gate on the second liner layer.

22 Claims, 34 Drawing Sheets

(51) Int. Cl.
*H01L 29/161* (2006.01)
*H01L 29/16* (2006.01)
*H01L 29/165* (2006.01)
*H01L 29/66* (2006.01)
*H01L 21/8238* (2006.01)

(56) References Cited

U.S. PATENT DOCUMENTS

| | | |
|---|---|---|
| 8,617,996 B1 | 12/2013 | Chi et al. |
| 8,753,940 B1 | 6/2014 | Wei et al. |
| 8,878,302 B2 | 11/2014 | Cheng et al. |
| 9,054,212 B2 | 6/2015 | Juengling |
| 2005/0019993 A1* | 1/2005 | Lee ................ H01L 29/42384 438/157 |
| 2006/0240622 A1* | 10/2006 | Lee ................ H01L 29/42392 438/257 |
| 2009/0289306 A1* | 11/2009 | Watanabe ....... H01L 21/823807 257/369 |
| 2012/0205719 A1 | 8/2012 | Juengling et al. |
| 2012/0252182 A1* | 10/2012 | Byun ................ H01L 27/1052 438/382 |
| 2013/0273705 A1* | 10/2013 | Liu ................ H01L 21/823431 438/283 |
| 2014/0117462 A1 | 5/2014 | Cheng et al. |
| 2014/0191324 A1* | 7/2014 | Cai ...................... H01L 29/785 257/368 |
| 2014/0227857 A1 | 8/2014 | Youn et al. |
| 2014/0227858 A1 | 8/2014 | Shen et al. |
| 2014/0264483 A1* | 9/2014 | Yoshida ........... H01L 21/28079 257/288 |
| 2014/0367795 A1* | 12/2014 | Cai .................... H01L 27/0886 257/392 |
| 2016/0035727 A1* | 2/2016 | Brunco ............. H01L 27/0924 257/369 |
| 2016/0043225 A1* | 2/2016 | Ching ................ H01L 29/1054 257/401 |
| 2016/0204215 A1* | 7/2016 | Chang ................ H01L 21/845 257/401 |
| 2016/0240535 A1* | 8/2016 | Cheng ............ H01L 21/823864 |
| 2017/0053921 A1* | 2/2017 | Jeong ................ H01L 27/1104 |

\* cited by examiner

SEMICONDUCTOR DEVICES AND METHODS OF FABRICATING THE SAME

CROSS-REFERENCE TO RELATED APPLICATIONS

This application claims priority under 35 U.S.C. § 119 to Korean Patent Application No. 10-2015-0050556, filed on Apr. 10, 2015, and Korean Patent Application No. 10-2015-0088937, filed on Jun. 23, 2015, in the Korean Intellectual Property Office, the disclosures of all of which are hereby incorporated by reference in their entirety.

BACKGROUND

Technical Field

Example embodiments of the inventive concepts relate to a semiconductor device and a method of fabricating the same.

Description of Related Art

Semiconductor devices are widely used in the electronics industry because of their small size, multi-function, and/or lower manufacturing costs. Semiconductor devices with improved characteristics have been demanded with the development of the electronics industry. For example, high-reliable, high-speed, and/or multi-functional semiconductor devices have been increasingly demanded. To satisfy these demands, structures of semiconductor devices become more complicated and integration degrees of semiconductor devices are increasing. In particular, a method of increasing mobility of electrons or holes has been developed to realize high-performance MOS field effect transistors

SUMMARY

Example embodiments of the inventive concepts provide a semiconductor device having a highly improved reliability and a method for manufacturing the same.

According to example embodiments of the inventive concepts, a method of fabricating a semiconductor device may include providing a substrate including an active pattern protruding from the substrate, forming a first liner layer on a substrate to cover the active pattern, forming a field isolation insulating layer on the first liner layer, etching the field isolation insulating layer and the first liner layer to form a field isolation pattern exposing an upper portion of the active pattern and covering a lower portion of the active pattern, forming a second liner layer on the upper portion of the active pattern and the field isolation pattern, forming a dummy gate on the second liner layer and crossing the active pattern, forming spacer patterns on sidewalls of the dummy gate and the second liner layer, etching the second liner layer which is formed on at least the active pattern and is not covered by the dummy gate and the spacer patterns, forming an interlayer insulating layer on the field isolation pattern and the active pattern at opposing sides of the dummy gate, forming an opening in the interlayer insulating layer by removing the dummy gate, forming a gate insulating pattern in the opening, and forming a gate pattern on the gate insulating pattern in the opening.

In some example embodiments, the method may further include etching the first liner layer on the active pattern until a top surface of the first liner layer is positioned at substantially a same level as or a lower level than a top surface of the field isolation pattern.

In some example embodiments, the second liner layer may be an insulating layer including nitride containing silicon or a high-k dielectric material.

In some example embodiments, the forming an opening may include exposing the second liner layer by removing the dummy gate and etching the exposed second liner layer such that a portion of the second liner layer remains under the spacer patterns.

In some example embodiments, the forming an opening may include exposing the second liner layer by removing the dummy gate and the forming a gate insulating pattern may include forming the gate insulating pattern on the second liner layer.

In some example embodiments, the method may further include forming source/drain patterns on the active pattern at opposing sides of the dummy gate.

In some example embodiments, the active pattern may include germanium or silicon-germanium and the source/drain patterns may include a germanium content greater than a germanium content of the active pattern.

In some example embodiments, the forming a source/drain pattern may include forming epitaxial layers on the active pattern at opposite sides of the dummy gate.

In some example embodiments, the method may further include forming an etch stop layer on the second liner layer. The forming a dummy gate may include forming the dummy gate on the etch stop layer. The dummy gate may cross the active pattern and the field isolation pattern. The forming a spacer pattern may include forming the spacer patterns on the sidewall of the dummy gate and the etch stop layer. The etching the second liner layer may include etching the etch stop layer and the second liner layer using the dummy gate and the spacer patterns as an etch mask.

According to example embodiments of the inventive concepts, a method of fabricating a semiconductor device may include forming a trench in a substrate to form an active pattern, forming a first liner layer in trench, the first liner layer covering a lower portion of the active pattern and exposing an upper portion of the active pattern, forming a field isolation pattern on the first liner layer in the trench, the field isolation pattern exposing an upper portion of the active pattern, forming a gate insulating pattern on the upper portion of the active pattern, forming a gate pattern on the gate insulating pattern and crossing the active pattern, forming a spacer pattern on a sidewall of the gate pattern, and forming a second liner pattern under the spacer pattern and being self-aligned with the spacer pattern.

In some example embodiments, the second liner pattern may include nitride containing silicon or a high-k dielectric material.

In some example embodiments, forming a second liner pattern may include forming a second liner layer on the upper portion of the active pattern, forming a dummy gate on the second liner layer and crossing the active pattern, forming the spacer pattern on the sidewall of the dummy gate, removing the second liner layer at the side of the dummy gate, forming a source/drain pattern at the side of the dummy gate, forming an interlayer insulating layer covering the source/drain pattern and exposing the dummy gate, removing the dummy gate to expose the second liner layer, and etching the expose second liner layer to expose the upper portion of the active pattern and form the second liner pattern under the spacer pattern.

In some example embodiments, the gate insulating pattern may be formed on the exposed upper portion of the active pattern to contact the spacer pattern and the second liner pattern.

In some example embodiments, the source/drain pattern may contact the spacer pattern and the second liner pattern and has a germanium content greater than a germanium content of the active pattern.

In some example embodiments, the method may further include forming an etch stop layer between the spacer pattern and the second liner pattern.

According to example embodiments of the inventive concepts, a method of fabricating a semiconductor device may include providing a substrate including a first region, a second region, and a third region, forming a first active pattern protruding from the first region and a second active pattern protruding from the second region, forming a first field isolation pattern on the first and second regions, the first field isolation pattern covering a lower portion of the first active pattern and a lower portion of the second active pattern, forming a second field isolation pattern on the third region, the second field isolation pattern separating the first region and the second region, forming a first liner layer between the lower portion of the first active pattern and the first field isolation pattern and between the lower portion of the second active pattern and the first field isolation pattern, forming a first gate pattern crossing a upper portion of the first active pattern and the first field isolation pattern on the first region, forming a first spacer pattern on a sidewall of the first gate pattern, and forming a first liner part between the first spacer pattern and the upper portion of the first active pattern. The first active pattern has a germanium content greater than a germanium content of the second active pattern.

In some embodiments, the method may further comprise forming a second gate pattern crossing an upper portion of the second active pattern and the first field isolation pattern, forming a second spacer pattern on a sidewall of the second gate pattern, and forming a second liner part interposed between the second spacer pattern and the upper portion of the second active pattern.

In some embodiments, the method may further comprise forming a third liner part disposed on the second field isolation pattern.

In some embodiments, the first liner part and the third liner part may include a same material.

In some embodiments, the first liner part and the third liner part may include nitride containing silicon or a high-k dielectric material.

In some embodiments, the first liner part may be formed to be self-aligned with the first spacer pattern.

In some embodiments, the first liner part may be formed to be disposed under the first spacer pattern and the first gate pattern.

According to example embodiments of the inventive concepts, a semiconductor device may include a substrate including an active pattern protruding from the substrate, a field isolation pattern covering a lower portion of the active pattern, a first liner layer between the lower portion of the active pattern and the field isolation pattern, a gate pattern crossing an upper portion of the active pattern, a spacer pattern on a sidewall of the gate pattern on the upper portion of the active pattern, and a second liner layer between the upper portion of the active pattern and the spacer pattern.

In some example embodiments, the device may further include a source/drain pattern at a side of the gate pattern. The upper portion of the active pattern may be exposed by the first liner layer and the field isolation pattern.

In some example embodiments, the second liner layer may include nitride containing silicon or a high-k dielectric material.

In some example embodiments, the second liner layer may extend between the gate insulating pattern and the upper portion of the active pattern.

In some example embodiments, the device may further include an etch stop layer between the spacer pattern and the second liner layer. The etch stop layer may include oxide.

In some example embodiments, the second liner layer may be a pattern self-aligned with the spacer pattern.

In some example embodiments, the spacer pattern may extend to the field isolation pattern, and the second liner layer extends between the field isolation pattern and the spacer pattern.

According to example embodiments of the inventive concepts, a semiconductor device may include a substrate including a first region, a second region, and a third region, a first active pattern protruding from the first region, a second active pattern protruding from the second region, a first field isolation pattern on the first and second regions, the first field isolation pattern covering a lower portion of the first active pattern and a lower portion of the second active pattern, a second field isolation pattern on the third region, the second field isolation pattern separating the first region and the second region, a first liner layer between the lower portion of the first active pattern and the first field isolation pattern and between the lower portion of the second active pattern and the first field isolation pattern, a first gate pattern crossing a upper portion of the first active pattern and the first field isolation pattern on the first region, a first spacer pattern on a sidewall of the first gate pattern, and a first liner part between the first spacer pattern and the upper portion of the first active pattern. The first active pattern may have a germanium content greater than a germanium content of the second active pattern.

In some embodiments, the device may further include a second gate pattern crossing an upper portion of the second active pattern and the first field isolation pattern, a second spacer pattern on a sidewall of the second gate pattern, and a second liner part interposed between the second spacer pattern and the upper portion of the second active pattern.

In some embodiments, the device may further include a third liner part disposed on the second field isolation pattern.

In some embodiments, the first liner part and the third liner part may include a same material.

In some example embodiments, the first liner part and the third liner part may include nitride containing silicon or a high-k dielectric material.

In some example embodiments, the device may further include a first source/drain pattern on the first active pattern at a side of the first gate pattern. The first source/drain pattern may have a germanium content greater than a germanium content of the first active pattern.

In some example embodiments, the first liner part may be a pattern self-aligned with the first spacer pattern.

In some example embodiments, the first liner part may be a pattern disposed under the first spacer pattern and the first gate pattern.

BRIEF DESCRIPTION OF THE DRAWINGS

Example embodiments of the inventive concepts will be more clearly understood from the following detailed description taken in conjunction with the accompanying drawings in which:

FIGS. 1A to 7A are perspective views illustrating a method of manufacturing a semiconductor device according to example embodiments of the inventive concepts;

FIGS. 1B to 7B are cross-sectional views taken along lines I-I' and II-II' of FIGS. 1A to 7A, respectively;

FIGS. 14A to 14F correspond to cross-sectional views taken along lines III-III', IV-IV', and V-V' of FIG. 13, respectively;

DETAILED DESCRIPTION OF THE EXAMPLE EMBODIMENTS

Figure 1A:
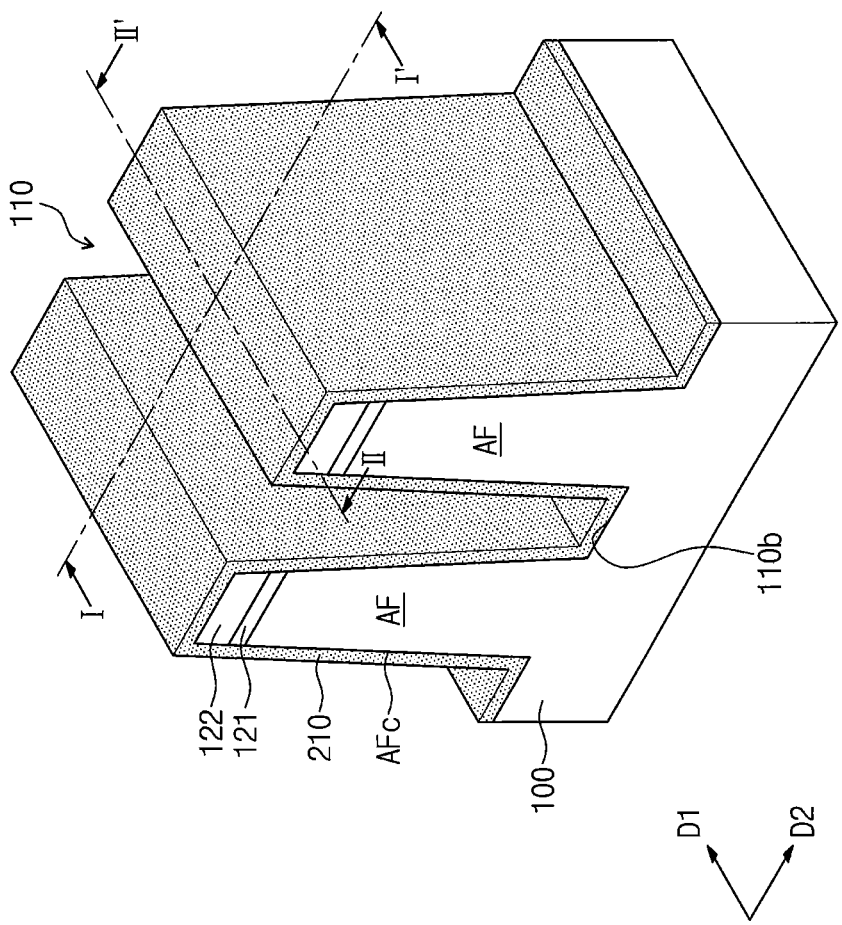

Various example embodiments will now be described more fully with reference to the accompanying drawings in which some example embodiments are shown. However, specific structural and functional details disclosed herein are merely representative for purposes of describing example embodiments. Thus, the inventive concepts may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the inventive concepts.

In the drawings, the thicknesses of layers and regions may be exaggerated for clarity, and like numbers refer to like elements throughout the specification.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, steps, operations, elements and/or components, but do not preclude the presence or addition of one or more other features, steps, operations, elements, components and/or groups thereof.

Spatially relative terms (e.g., "under," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional and plan illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. The regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in a same electronic device. For example, when a single active region is illustrated in a cross-sectional view of a device/structure, the device/structure may include a plurality of active regions and transistor structures thereon, as would be illustrated by a plan view of the device/structure. The plurality of device structures may be arranged in an array and/or in a two-dimensional pattern.

In order to more specifically describe example embodiments, various features will be described in detail with reference to the attached drawings. However, example embodiments described are not limited thereto.

FIGS. 1A to 7A are perspective views illustrating a method of manufacturing a semiconductor device according to example embodiments of the inventive concepts. FIGS. 1B to 7B illustrate cross-sectional views taken along lines I-I' and II-II' of FIGS. 1A to 7A, respectively.

Figure 1B:
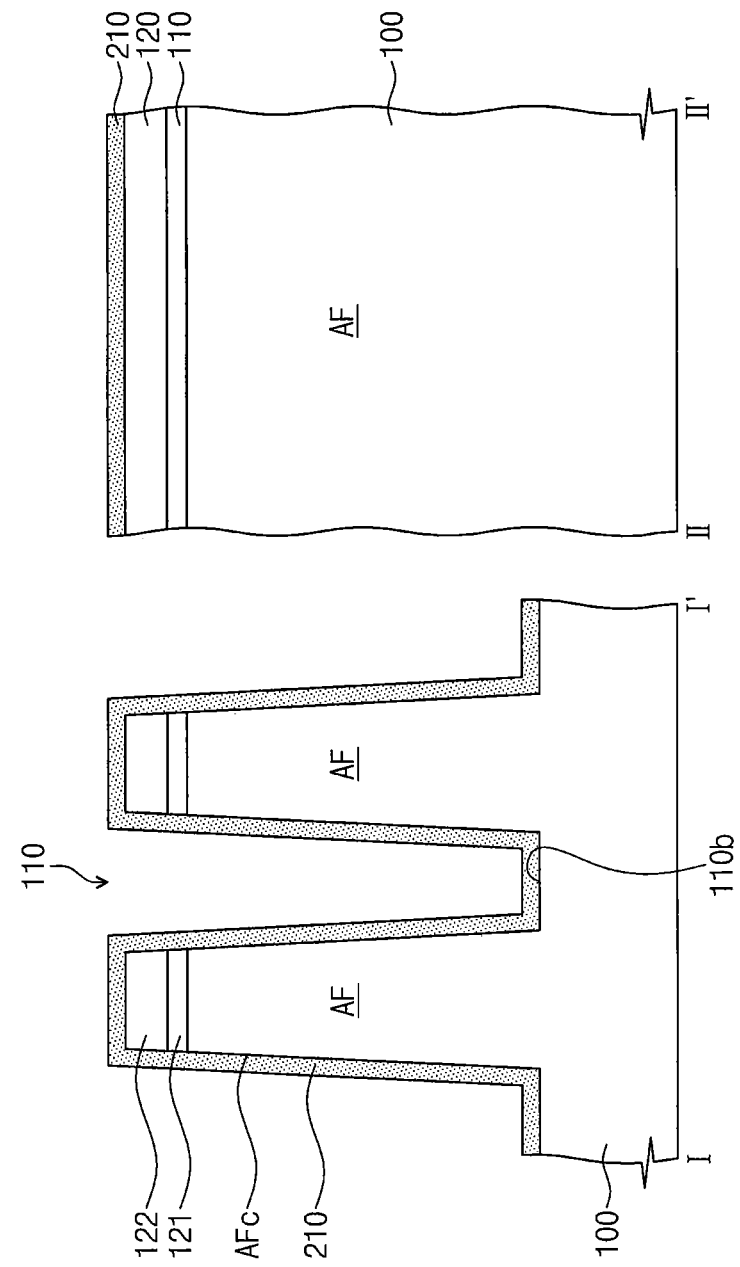
Figure 2A:
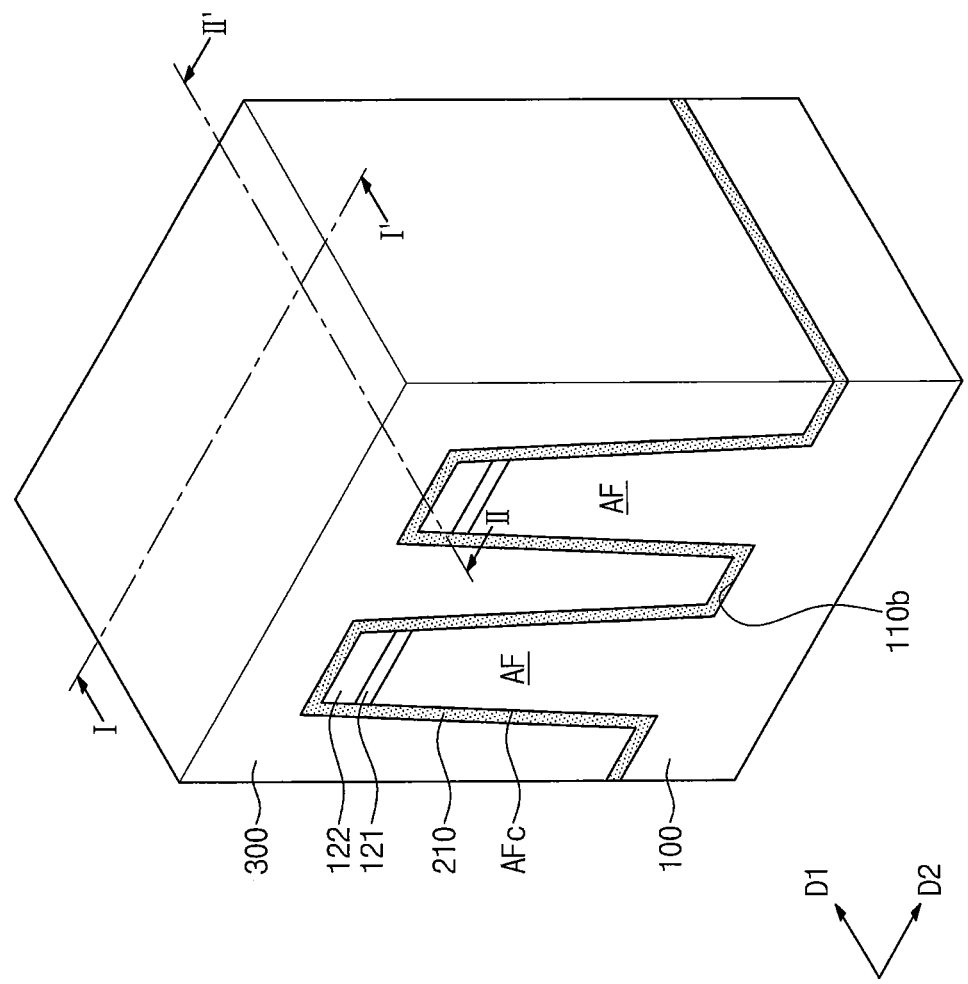
Figure 2B:
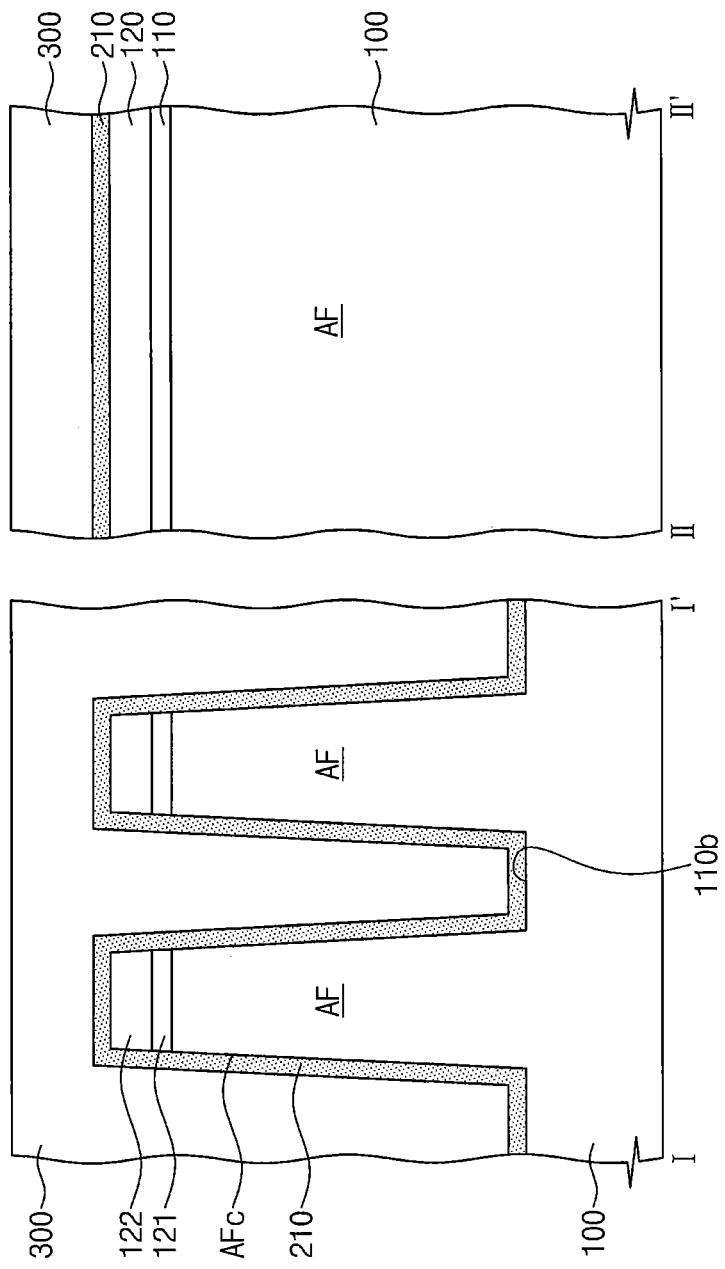
Figure 3A:
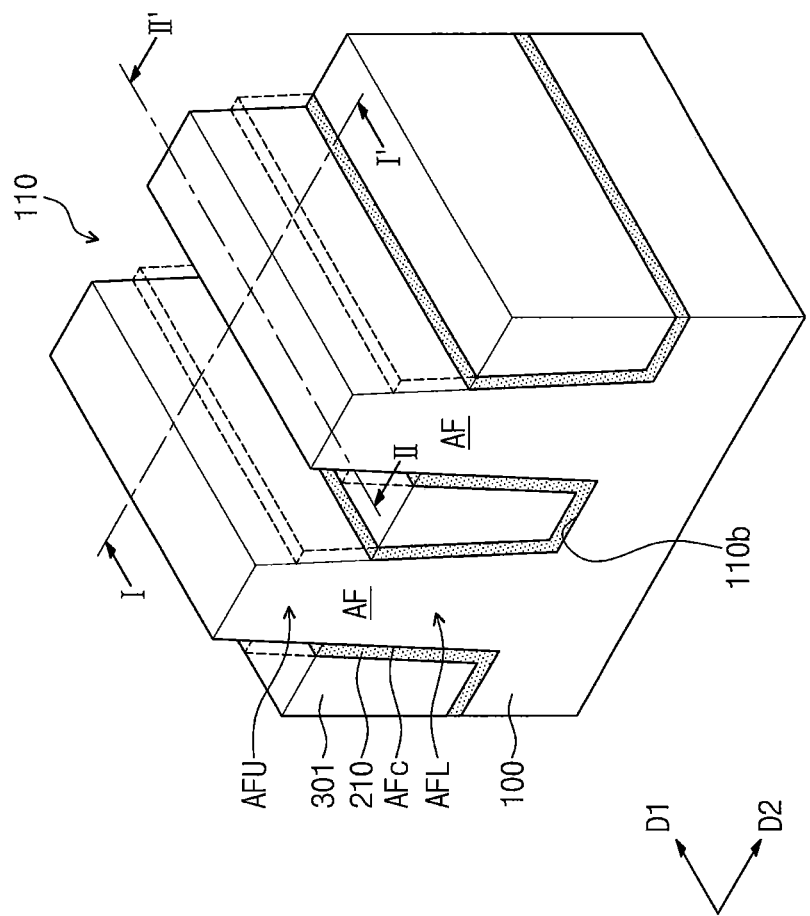
Figure 3B:
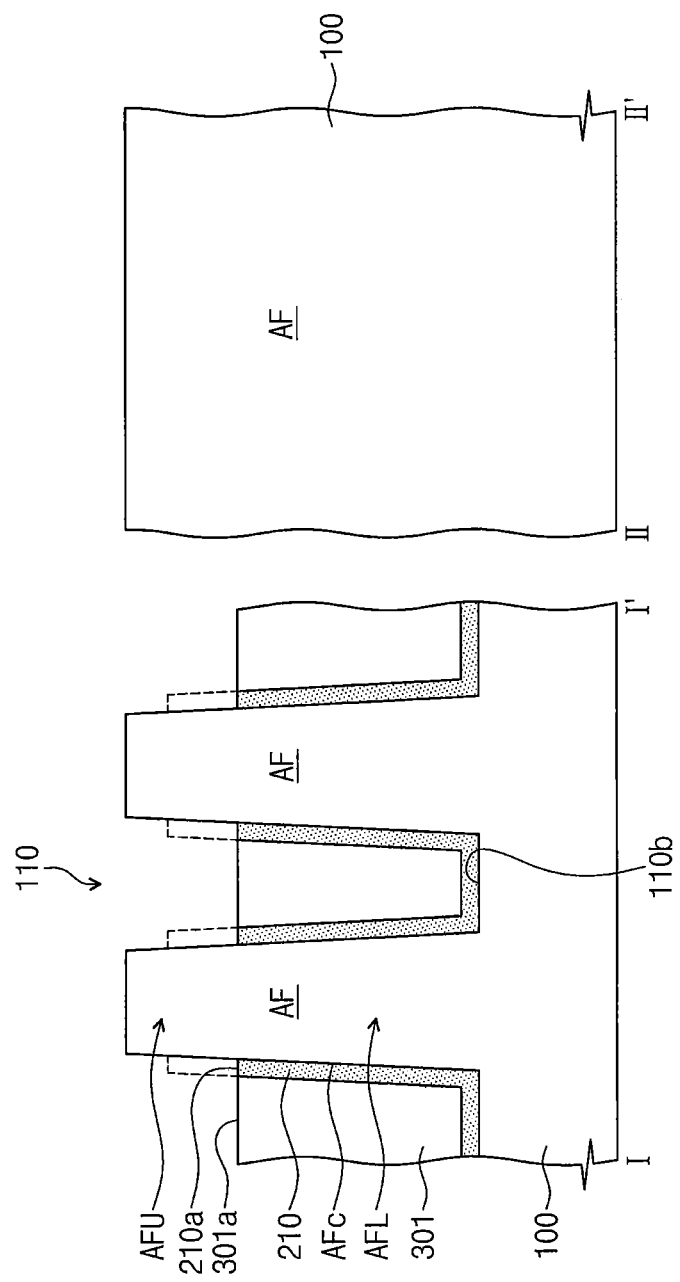

Referring to FIGS. 1A and 1B, an active pattern AF may be provided on a substrate 100. The substrate 100 may include the active pattern AF which may upwardly protrude from the substrate 100. The active pattern AF may be a fin-type active pattern. The active pattern AF may be provided in plural on the substrate 100. The active pattern AF may include germanium (Ge). As an example, the substrate 100 may be a germanium substrate, a germanium-on-insulator (GOI) substrate, and/or a silicon-germanium (Si—Ge) substrate. As other examples, a crystalline silicon substrate grown by an epitaxial process may be provided as the substrate 100. When the crystalline silicon substrate grows, the crystalline silicon substrate may be doped with germanium (Ge). A first and second mask patterns 121 and 122 which are stacked may be formed on the substrate 100. A trench 110 may be formed in the substrate 100 by etching the substrate 100 which is exposed by the first and second mask pattern 121 and 122. The first mask pattern 121 may include, for example, silicon oxide and the second mask pattern 122 may include, for example, silicon nitride, but the inventive concepts are not limited thereto. The active pattern AF may be defined by the trench 110, but the inventive concepts are not limited thereto. In some embodiments, the active pattern AF including germanium may be formed by using various kinds of substrates and performing various patterning processes.

The active pattern AF may extend in a first direction D1. The first direction D1 may be parallel to a bottom surface of the substrate 100. As an example, the first direction D1 may be parallel to a length direction of the active pattern AF. The active pattern AF may include germanium (Ge) or silicon-germanium (SiGe). Since germanium (Ge) has a lattice constant greater than that of silicon (Si), carrier (e.g., hole or electron) mobility in the active pattern AF may be increased.

A first liner layer 210 may be formed on the substrate 100. The first liner layer 210 may be formed using an atomic layer deposition (ALD) process, a lower pressure chemical vapor deposition (LPCVD) process, a plasma enhanced chemical deposition (PECVD) process, or a plasma nitridation process. The first liner layer 210 may cover a bottom surface 110b of the trench 110 and side surfaces AFc of the active pattern AF. In some embodiments, the first liner layer 210 may include nitride containing silicon. The first liner layer 210 may include, for example, SiN, SiCN, SiBN, and/or SiCBN. The first liner layer 210 may not include oxygen. In some embodiments, the first liner layer 210 may include a high-k dielectric material. The high-k dielectric material for the first liner layer 210 may be a material having a dielectric constant greater than a dielectric constant of silicon nitride. The first liner layer 210 may include, for example, $Al_2O_3$, $ZrO_2$, $La_2O_3$, $HfO_2$, HfAlO, HfLaO, $Ta_2O_5$, $TiO_2$, $La_2O_3$, $Y_2O_3$, $SrTiO_3$, $LaAlO_3$, $Y_2O_3$, HfON, ZrON, $La_2ON$, $Al_2ON$, TiON, SrTiON, LaAlON, $Y_2ON$, and/or a silicate thereof Referring to FIGS. 2A and 2B, a field isolation insulating layer 300 may be formed on the substrate 100. The field isolation insulating layer 300 may fill the trench 110 and may cover the first liner layer 210 on the second mask pattern 122. The field isolation insulating layer 300 may include an oxide layer. The field isolation insulating layer 300 may be formed using a deposition process or a coating process. The field isolation insulating layer 300 may include, for example, a high-density plasma (HDP) oxide layer, a spin on glass (SOG) layer, and/or a chemical vapor deposition (CVD) oxide layer.

Defects (e.g., dangling bonds) may be generated on the bottom surface 110b of the trench 110 and the side surfaces AFc of the active pattern AF by the etching process for forming the active pattern AF. When the process of forming the field isolation insulating layer 300 is performed on the active pattern AF, the active pattern AF may be oxidized by heat generated during the formation of the field isolation insulating layer 300 and oxygen for forming the field isolation insulating layer 300 due to the defects thereof. However, according to example embodiments of the inventive concepts, the first liner layer 210 without oxygen may cover the active pattern AF during the formation of the field isolation insulating layer 300. Thus, the active pattern AF may be protected from damage (e.g., oxidation) during the formation of the field isolation insulating layer 300 by the first liner layer 210. In some embodiments, the first liner layer 210 may have a strong cohesiveness with oxygen. Thus, oxygen in the first liner layer 210 may not be moved into the active pattern AF. Further, the first liner layer 210 may obstruct a migration of oxygen into the active pattern AF while the process of forming the field isolation insulating layer 300 is performed.

Referring to 3A and 3B, a field isolation pattern 301 may be formed by etching the field isolation insulating layer 300 to expose an upper portion AFU of the active pattern AF. The field isolation pattern 301 may be provided on the side surfaces AFc of a lower portion AFL of the active pattern AF and may cover the first liner layer 210. The upper portion AFU of the active pattern AF may correspond to a portion of the active pattern AF exposed by the field isolation pattern 301 and the lower portion AFL of the active pattern AF may correspond to a portion of the active pattern AF by the field isolation pattern 301. The first and second mask pattern 121 and 122 and a portion of the first liner layer 210 may be removed together during or after etching the field isolation insulating layer 300. After the portion of the first liner layer 210 is removed, the first liner layer 210 may have a top surface 201a positioned at substantially the same level as or a lower level than a top surface 301a of the field isolation pattern 301. In some embodiments, as shown with a dotted line, the first liner layer 210 may remain on the upper portion AFU of the active pattern AF. Thus, the first liner layer 210 may be additionally removed until the first liner layer 210 has the top surface 210a positioned at substantially the same level as or a lower level than the top end 301a of the field isolation pattern 301. As an example, a portion of the first liner layer 210 may be removed using a dry etching process, for example, such as a chemical oxide removal (COR) process or a plasma native oxide cleaning (PNC) process. As other examples, a portion of the first liner layer 210 may be removed by a wet etching process using, for example, hydrofluoric acid (HF) and/or phosphoric acid ($H_3PO_4$). Thus, the upper portion AFU of the active pattern AF may be exposed by the first liner layer 210 and the lower portion AFL of the active pattern AF may be protected from the field isolation pattern 301 by the first liner layer 210 interposed therebetween.

Figure 4A:
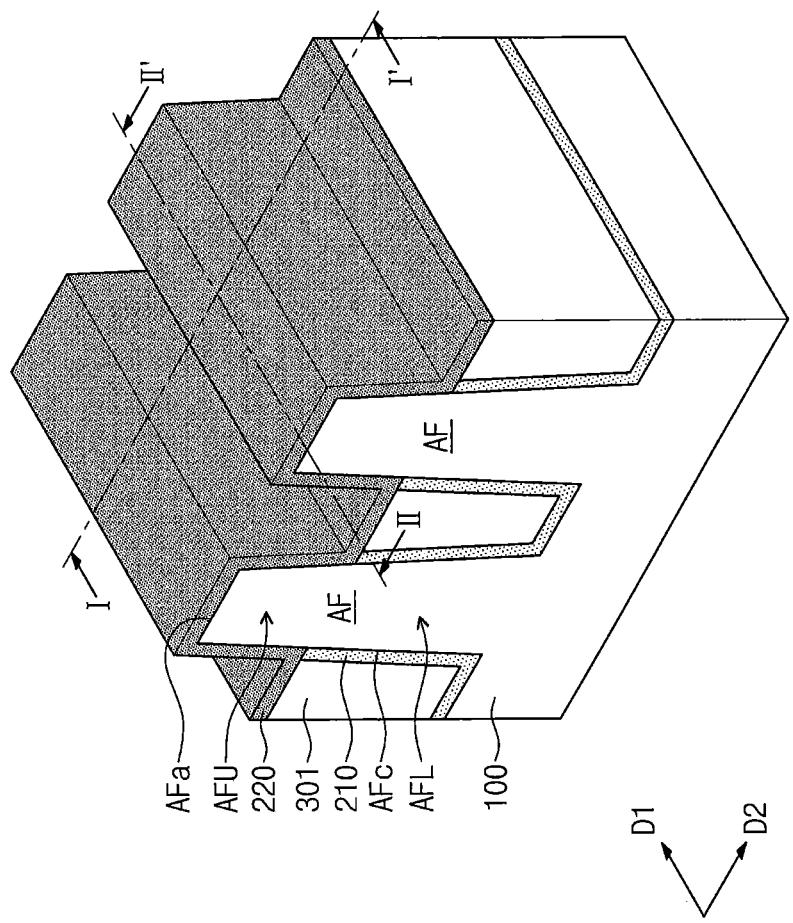
Figure 4B:
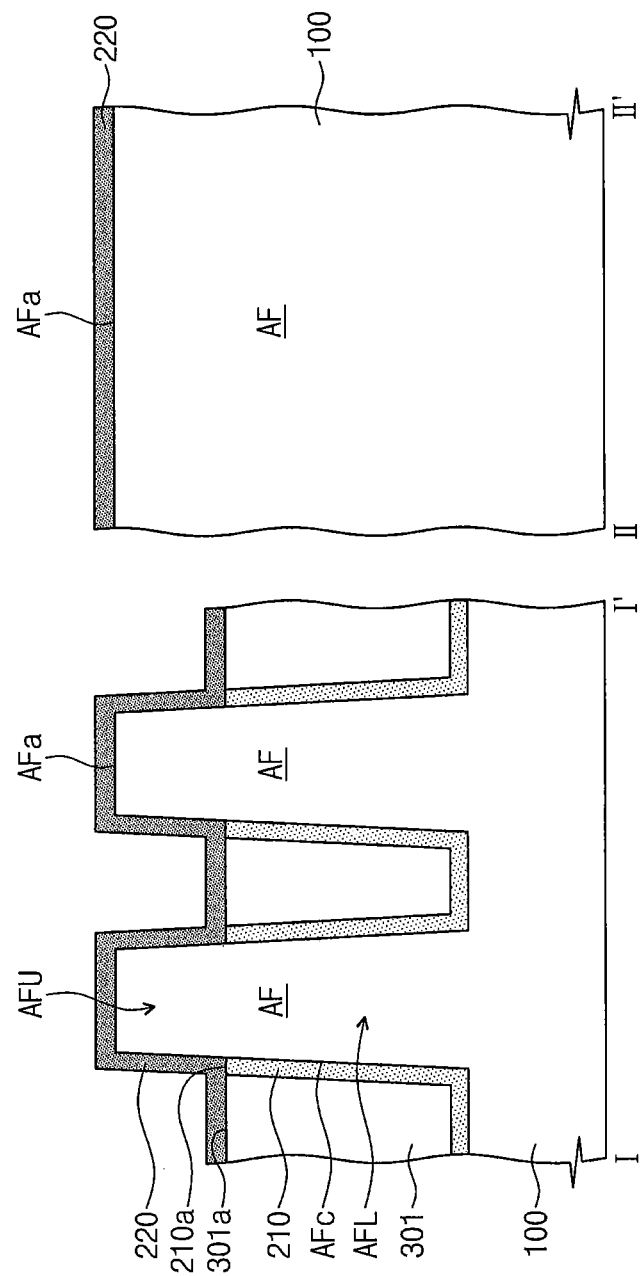

Referring to FIGS. 4A and 4B, a second liner layer 220 may be formed on the substrate 100 to cover the upper portion AFU of the active pattern AF and the field isolation pattern 301. The second liner layer 220 may be provided on the side surfaces AFc and a top surface AFa of the upper portion AFU of the active pattern AF and the top surface 301a of the field isolation pattern 301. The second liner layer 220 may be conformally formed along the side surfaces AFc of the upper portion AFU of the active pattern AF. The second liner layer 220 may be formed using an atomic layer deposition (ALD) process, a lower pressure chemical vapor deposition (LPCVD) process, a plasma enhanced chemical deposition (PECVD) process, or a plasma nitridation process. In some embodiments, the second liner layer 220 may include nitride containing silicon. The second liner layer 220 may include, for example, SiN, SiCN, SiBN, and/or SiCBN. The second liner layer 220 may not include oxygen. In some embodiments, the second liner layer 220 may include a high-k dielectric material. The high-k dielectric material for the first liner layer 210 may be a material having a dielectric constant greater than a dielectric constant of silicon nitride. The second liner layer 220 may include, for example, $Al_2O_3$, $ZrO_2$, $La_2O_3$, $HfO_2$, HfAlO, HfLaO, $Ta_2O_5$, $TiO_2$, $La_2O_3$, $Y_2O_3$, $SrTiO_3$, $LaAlO_3$, $Y_2O_3$, HfON, ZrON, $La_2ON$, $Al_2ON$, TiON, SrTiON, LaAlON, $Y_2ON$, and/or a silicate thereof.

Figure 5A:
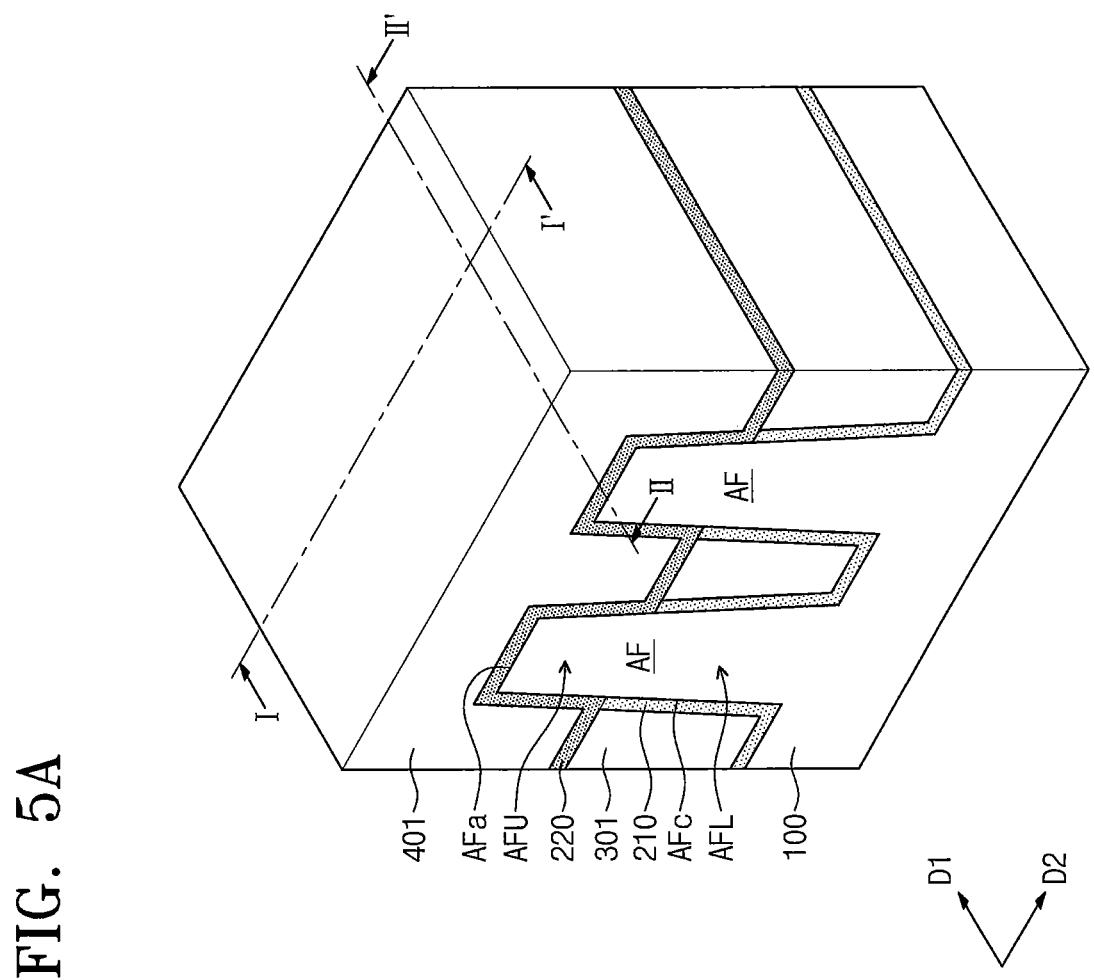
Figure 5B:
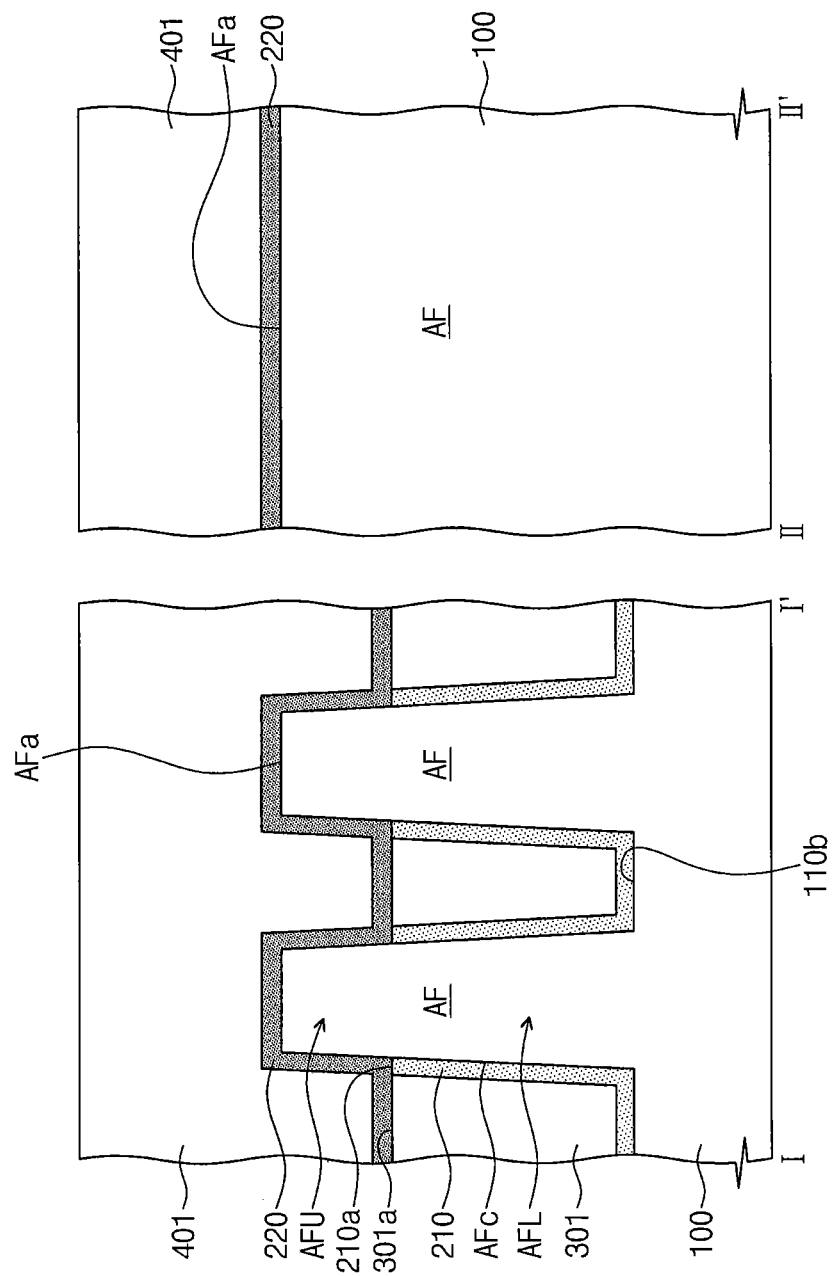

Referring to FIGS. 5A and 5B, a dummy gate layer 401 may be formed on the second liner layer 220. The dummy gate layer 401 may include, for example, poly-silicon. In some embodiments, the dummy gate layer 401 may include a poly-silicon layer and a capping layer thereon. The capping layer for dummy gate layer 401 may include oxide and/or nitride. The second liner layer 220 may cover the upper portion AFU of the active pattern AF, so the active pattern AF may not be damaged during the formation of the dummy gate layer 401. For example, the active pattern AF may not be oxidized by oxygen and heat which may be generated during the formation of the dummy gate layer 401. In the case where the first liner layer 210 remains on the side surfaces AFs of the upper portion AFU of the active pattern AF as illustrated in a dot line in FIGS. 3A and 3B, the second liner layer 220 formed on the side surfaces AFs of the upper portion AFU of the active pattern AF may have step-wise structure on the side surfaces AFs of the upper portion AFU of the active pattern AF. Thus, a width of a space defined by the second liner layer 220 in the trench 110 may be decreased. As a result, a seam or a void may be generated in the dummy gate layer 401 which may be formed on the second liner 220 and may fill the space. According to the example embodiments of inventive concepts, since the first liner layer 210 has the top surface 210a positioned at substantially the same level as or a lower level than the top surface 301a of the field isolation pattern 301, the first liner layer 210 may not be interposed between the second liner layer 220 and the upper portion AFU of the active pattern AF and the second liner layer 220 may have a flat shape on the side surfaces AFc of the upper portion AFU of the active pattern AF. Accordingly, since the space defined by the second liner layer 220 has an increased width, the dummy gate layer 401 may be uniformly formed on the second liner layer 220 to fill the space.

Figure 6A:
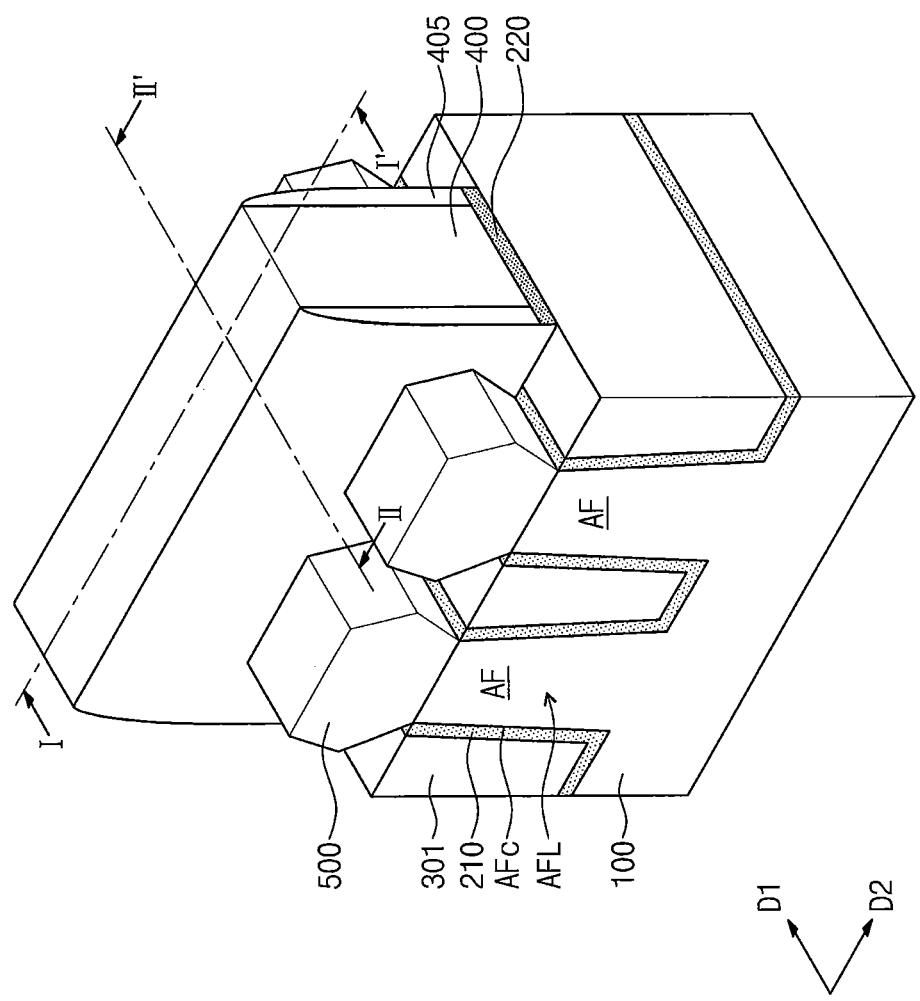
Figure 6B:
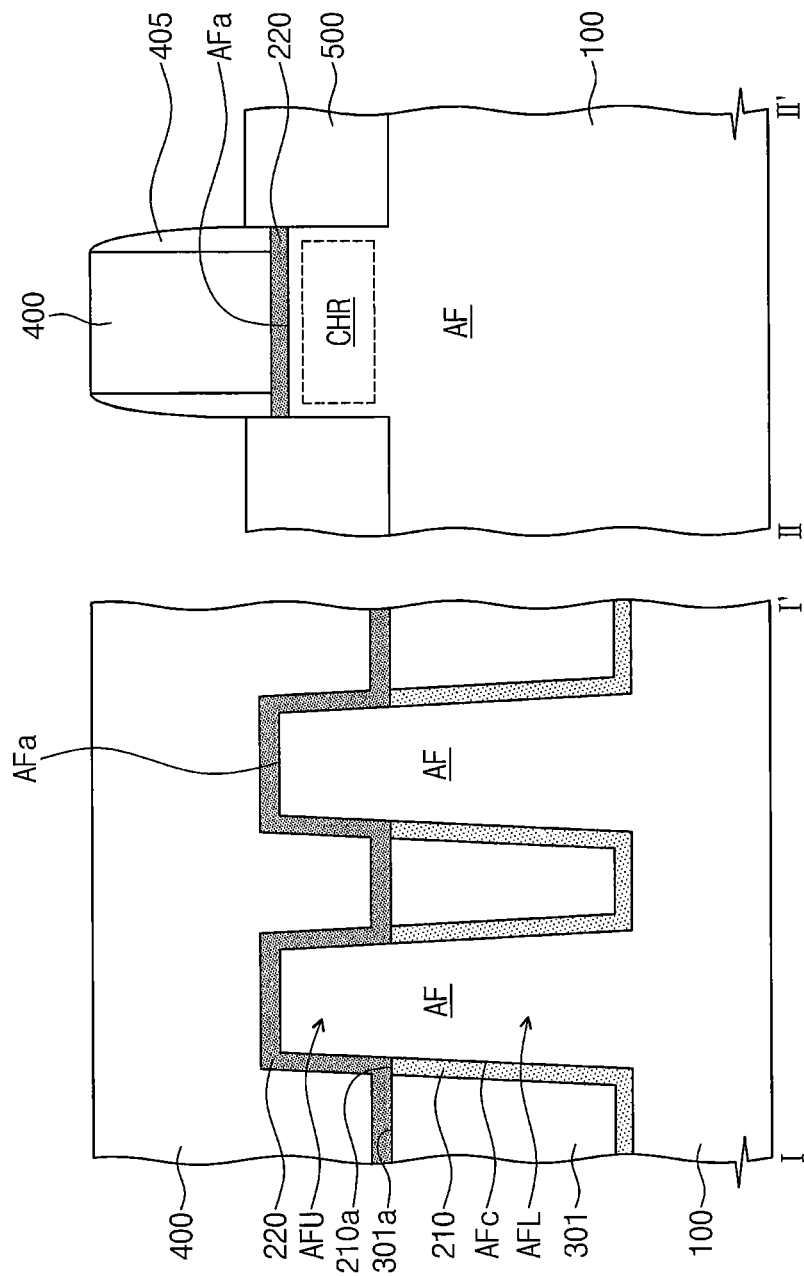

Referring to FIGS. 6A and 6B, a dummy gate 400 may be formed by patterning the dummy gate layer 401. The dummy gate 400 may extend in the second direction D2 across the first direction D1. The second direction D2 may be parallel to the bottom surface of the substrate 100. As an example, the second direction D2 may be parallel to a width direction of the active pattern AF. Spacer patterns 405 may be formed on opposing sidewalls of the dummy gate 400. That is, the spacer patterns 405 may be formed on the second liner layer 220 at opposing sides of the dummy gate 400. The spacer patterns 405 may be provided on the field isolation pattern 301 and the active pattern AF and may extend in the second direction D2. The formation of the spacer patterns 405 may include forming a spacer layer on the second liner layer 220 to cover the dummy gate 400 and etching-back the spacer layer. After the spacer patterns 405 are formed, the second liner layer 220 may be etched. Accordingly, a portion of the second liner layer 220 under the dummy gate 400 and the spacer pattern 405 may remain and other portion of the second liner layer 220 which is not covered the dummy gate 400 and the spacer pattern 405 may be removed. That is, the second liner layer 220 exposed by the spacer patterns 405 and the dummy gate 400 may be removed. Thus, the remaining second liner layer 220 may extend in the second direction D2 and may be provided on the top surface 301a of the field isolation pattern 301 and the top and side surfaces AFa and AFc of the upper portion AFU of the active pattern AF under the spacer patterns 405 and the dummy gate 400. Source/drain patterns 500 may be provided on the active pattern AF at opposing sides of the dummy gate 400. That is, the source/drain patterns 500 may be provided on the active pattern AF exposed by the spacer patterns 405 and the dummy gate 400. The formation of the source/drain patterns 500 may include removing a portion of the active pattern AF at opposing sides of the dummy gate 400 and forming an epitaxial layer on the recessed active pattern AF. In some embodiments, the formation of the source/drain patterns 500 may include forming an epitaxial layer on the exposed active pattern AF which is not recessed at the opposing sides of the dummy gate 400. The epitaxial layer may be formed using, for example, a selective epitaxial growth (SEG) process. A portion of the active pattern AF between adjacent respective ones of the source/drain patterns 500 may be defined as a channel region CHR. The source/drain patterns 500 may have a bottom surface positioned at a lower level than a top surface of the channel region (e.g., the top surface AFa of the active pattern AF). The source/drain patterns 500 may include a germanium (Ge) content greater than that of the active pattern AF, so the source/drain patterns 500 may induce a compressive strain in the channel region CHR. Further, the source/drain patterns 500 may be doped with p-type dopants. In some embodiments, the source/drain patterns 500 may include silicon (Si) or silicon carbide (SiC) and may induce a tensile strain in the channel region CHR. Further, the source/drain patterns 500 may be doped with n-type dopants.

Figure 7A:
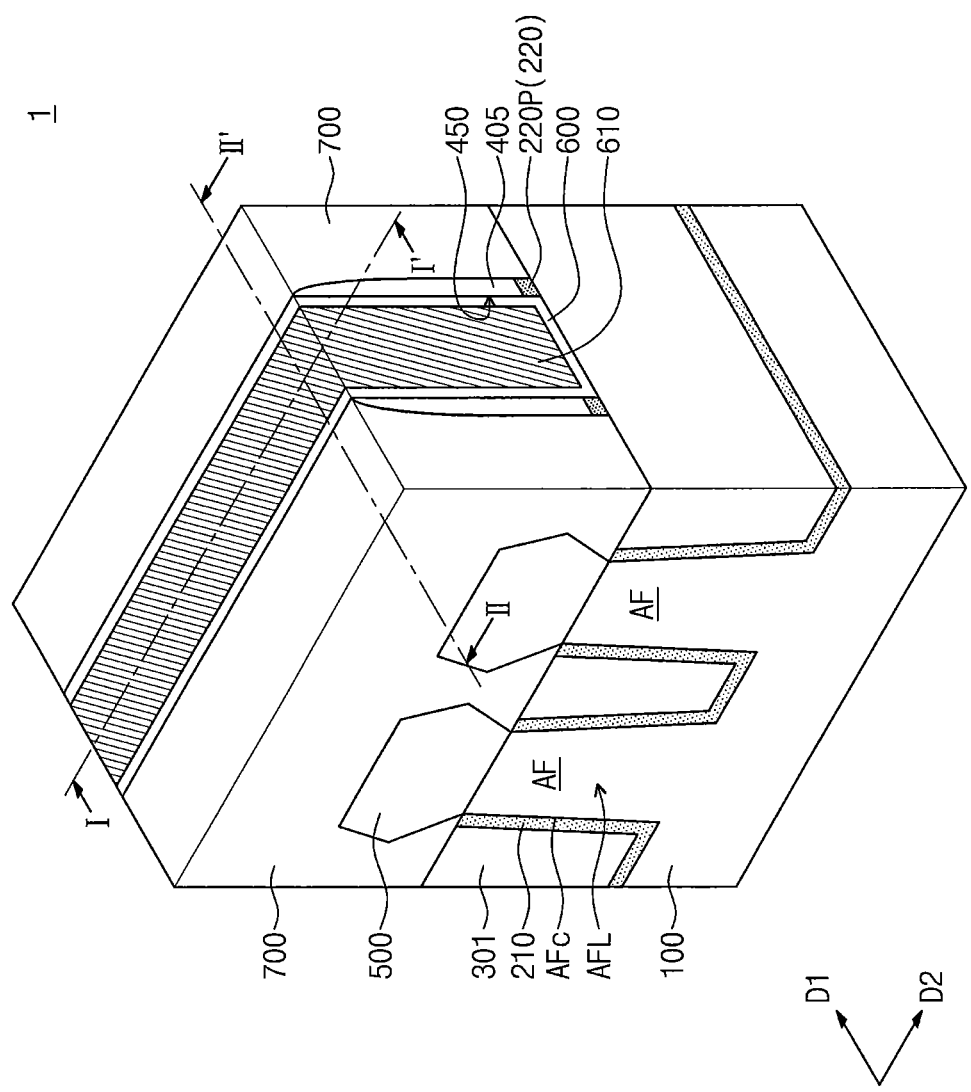
Figure 7B:
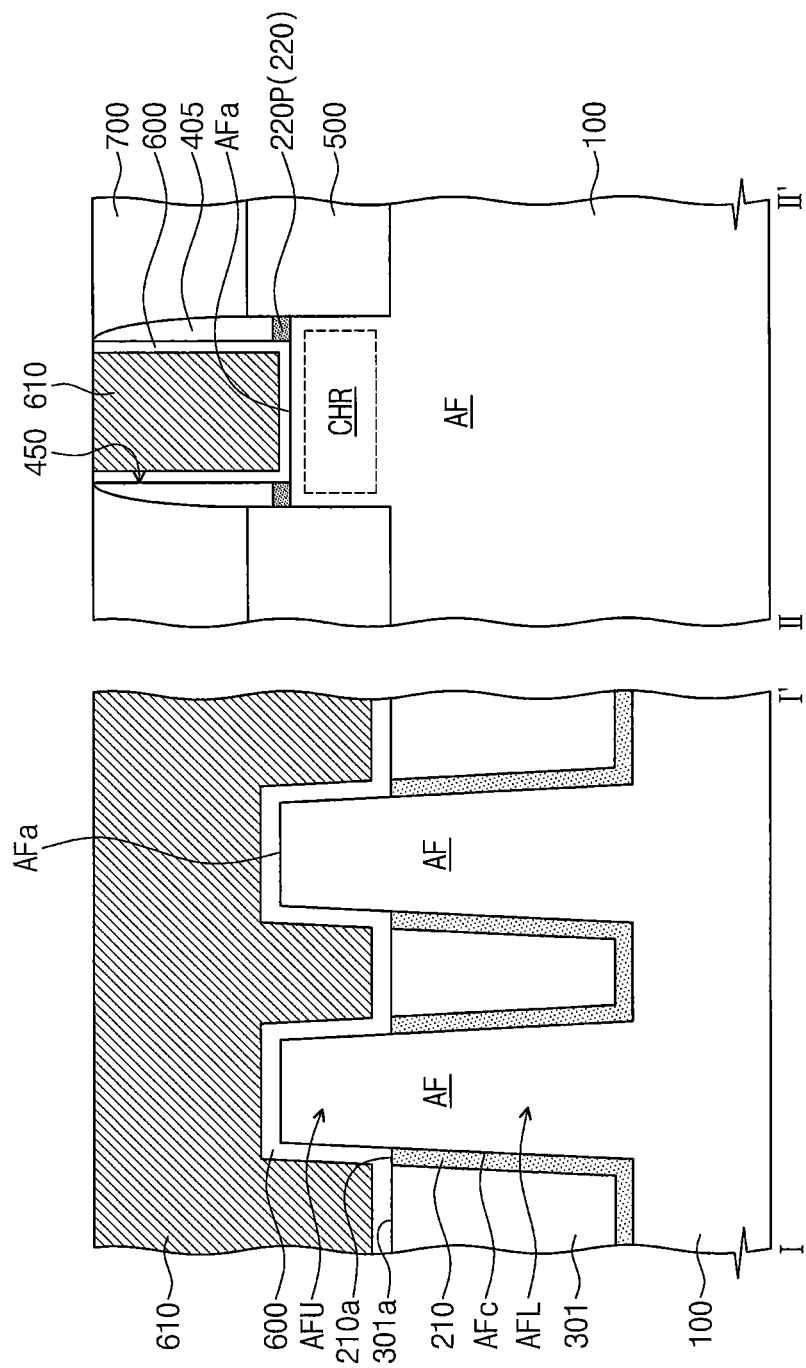

Referring to FIGS. 7A and 7B, an interlayer insulation layer 700 may be formed on the substrate 100 to cover the source/drain patterns 500. The interlayer insulating layer 700 may be formed on the field isolation pattern 301 and the source/drain patterns 500 at opposing sides of the dummy gate 400 of FIGS. 6A and 6B and may expose a top surface of the dummy gate 400 of FIGS. 6A and 6B. An opening 450 may be formed in the interlayer insulation layer 700 by removing the dummy gate 400 of FIGS. 6A and 6B. When the dummy gate 400 of FIGS. 6A and 6B is removed, the spacer patterns 405 may not be removed. Thus, the opening 450 may be defined by the spacer patterns 405. The opening 450 may extend in the second direction D2 on the field isolation pattern 301 and the active pattern AF. The formation of the opening 450 may further include removing the dummy gate 400 of FIGS. 6A and 6B to expose the second liner layer 220, and selectively removing the exposed second liner 220 so that a portion of the second liner 220 may remain under the spacer patterns 405. Thus, the side surfaces AFc and the top surface AFa of the upper portion AFU of the active pattern AF may be exposed by the opening 450. As a result, the second liner layer 220 may remain under the spacer patterns 405 and may be defined as second liner patterns 220P, each of which is self-aligned with a respective one of the spacer patterns 405. For example, each of the second liner patterns 220P may have sidewalls aligned to the sidewalls of a respective one of the spacer patterns 405 and may be formed on the field isolation pattern 301 and the active pattern AF. Each of the second liner patterns 220P may have substantially the same width as that of the lower portion of a respective one of the spacer patterns 405 in the first direction D1. The second liner patterns 220P may extend along bottom surfaces of the spacer patterns 405 in the second direction D2, respectively. The second liner patterns 220P may be in contact with the source/drain patterns 500. A gate insulating pattern 600 and a gate pattern 610 may be formed on the substrate 100. The gate insulating pattern 600 may be formed on an inner wall of the opening 450 and may cover the top and side surfaces AFa and AFc of the upper portion AFU of the active pattern AF. The gate insulating pattern 600 may contact the spacer patterns 405 and the second liner patterns 220P under the spacer patterns 405. The gate insulating pattern 600 may include, for example, silicon oxide, silicon oxynitride, and/or a high-k dielectric material. The high-k dielectric material for the gate insulating pattern 600 may be a material having a dielectric constant greater than a dielectric constant of silicon nitride. The high-k dielectric material of the gate insulating pattern 600 may include, for example, $Al_2O_3$, $ZrO_2$, $La_2O_3$, $HfO_2$, HfAlO, HfLaO, $Ta_2O_5$, $TiO_2$, $La_2O_3$, $Y_2O_3$, $SrTiO_3$, $LaAlO_3$, $Y_2O_3$, HfON, ZrON, $La_2ON$, $Al_2ON$, TiON, SrTiON, LaAlON, $Y_2ON$, and/or a silicate thereof.

The gate pattern 610 may be formed on the gate insulating pattern 600 in the opening 450. The gate pattern 610 may fill at least a portion of the opening 450. The gate insulating pattern 600 may cover a bottom surface and sidewalls of the gate pattern 610. The gate insulating pattern 600 and the gate pattern 610 may cross the upper portion AFU of the active pattern AF and the field isolation pattern 301. The gate insulating pattern 600 and the gate pattern 610 may extend in the second direction D2. Spacer patterns 405 may be disposed on opposing sidewalls of the gate pattern 610, and the gate insulating pattern 600 may be interposed between the spacer patterns 405 and the gate pattern 610. The gate pattern 610 may include a conductive material, for example, a metal. The gate pattern 610 may include a plurality of conductive layers. A semiconductor device 1 may be fabricated by above-described processes. As a result, in the example embodiments, the first liner layer 210 may interposed between the lower portion AFL of the active pattern AF and the filed isolation pattern 301, and the second liner layer 220 (i.e., second liner patterns 220P) may be interposed between the spacer patterns 405 and the upper portion AFU of the active pattern AF and between the spacer patterns 405 and the field isolation pattern 301.

Figure 8A:
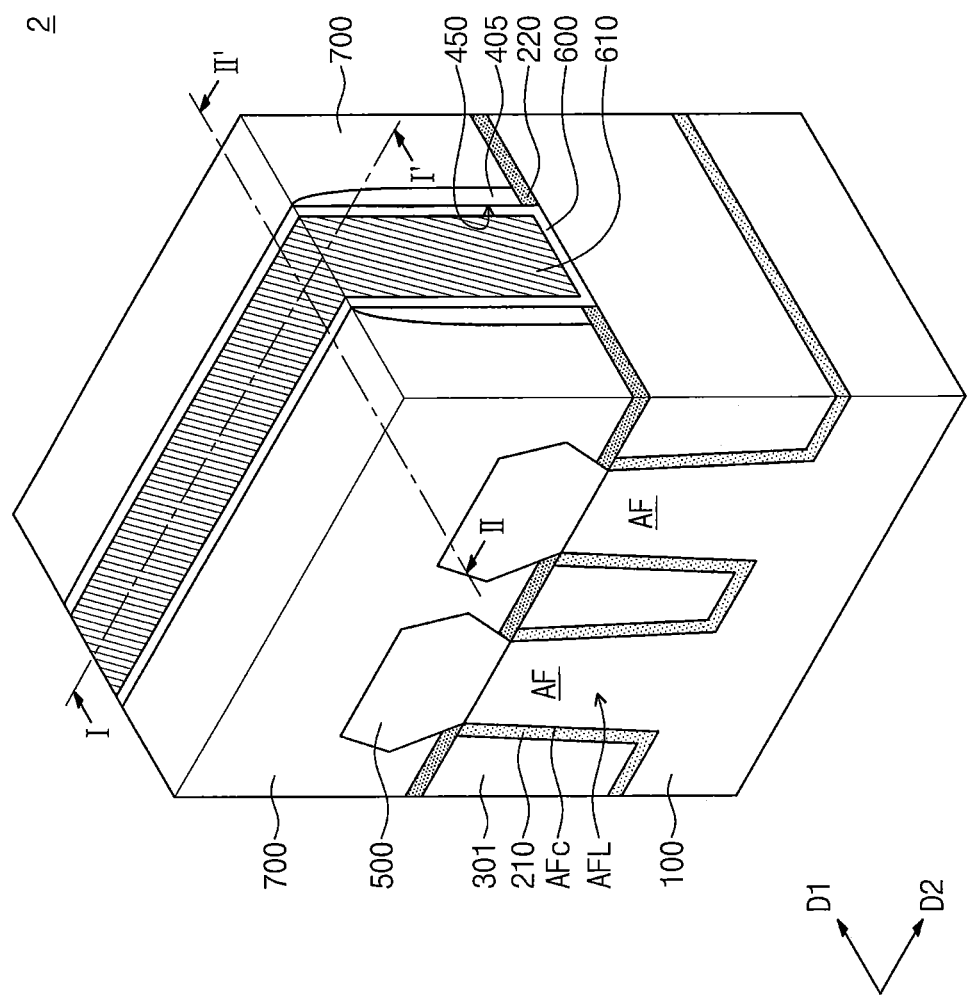
FIG. 8A is a perspective view illustrating a semiconductor device according to example embodiments of the inventive concepts.
Figure 8B:
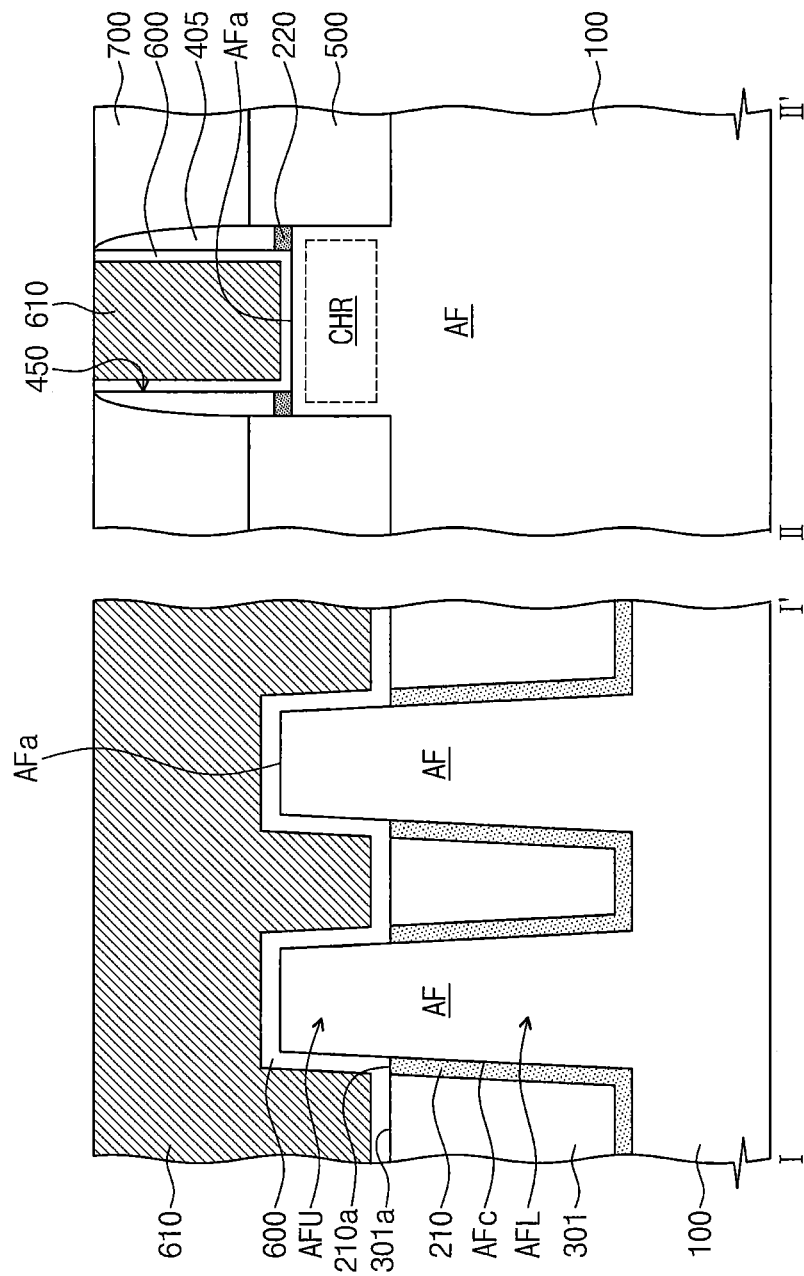
FIG. 8B is a cross-sectional view taken along lines I-I' and II-II' of FIG. 8A

FIG. 8A is a perspective view illustrating a semiconductor device according to example embodiments of the inventive concepts. FIG. 8B is a cross-sectional view taken along lines I-I' and II-II' of FIG. 8A. Hereinafter, the descriptions to the same elements as described in the embodiments illustrated in FIGS. 1A to 7B will be omitted or mentioned briefly for the purpose of ease and convenience in explanation.

Referring to FIGS. 8A and 8B, a semiconductor device 2 may include a substrate 100 including an active pattern AF, a first liner layer 110, a second liner layer 220, a field isolation pattern 301, source/drain patterns 500, a gate insulating pattern 600, a gate pattern 610, and an interlayer insulating layer 700. The active pattern AF may include germanium or silicon-germanium. The first liner layer 210 may interposed between the field isolation pattern 301 and the lower portion AFL of the active pattern AF. In some example embodiments, the second liner layer 220 may be further provided between the field isolation pattern 301 and the interlayer insulating layer 700 as illustrated in FIG. 8A. For example, the second liner layer 220 on the active pattern AF may be etched to form the source/drain patterns 500.

Figure 9A:
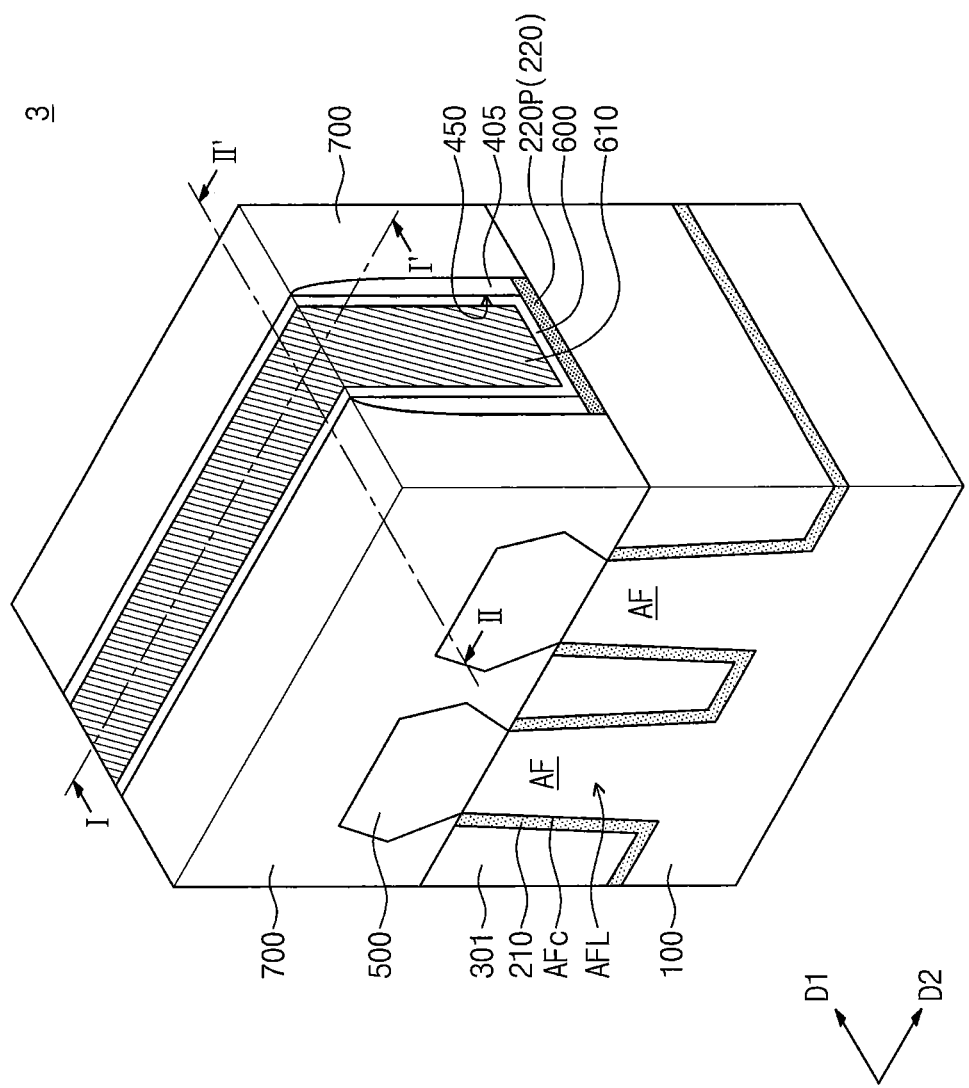
FIG. 9A is a perspective view illustrating a semiconductor device according to example embodiments of the inventive concepts.
Figure 9B:
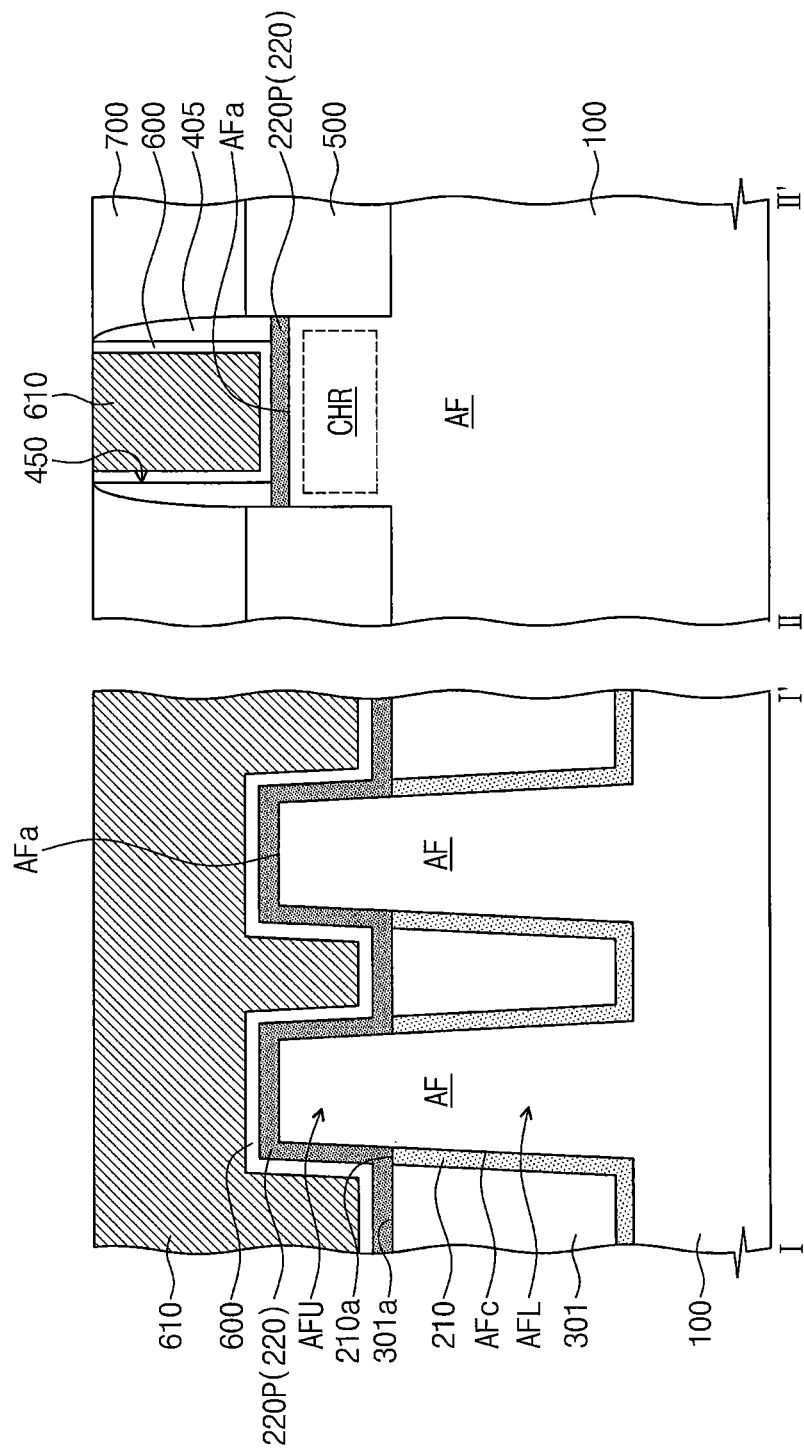
FIG. 9B is a cross-sectional view taken along lines I-I' and II-II' of FIG. 9A.

FIG. 9A is a perspective view illustrating a semiconductor device according to example embodiments of the inventive concepts. FIG. 9B is a cross-sectional view taken along lines I-I' and II-II' of FIG. 9A. Hereinafter, the descriptions to the same elements as described in the embodiments illustrated in FIGS. 1A to 7B will be omitted or mentioned briefly for the purpose of ease and convenience in explanation.

Referring to FIGS. 9A and 9B, a semiconductor device 3 may include a substrate 100 including an active pattern AF, a first liner layer 110, a second liner layer 220, a field isolation pattern 301, source/drain patterns 500, a gate insulating pattern 600, a gate pattern 610, and an interlayer insulating layer 700. The active pattern AF may include germanium or silicon-germanium. The first liner layer 210 may be interposed between the field isolation pattern 301 and a lower portion AFL of the active pattern AF. Unlike the semiconductor device 2 of FIGS. 8A and 8B, the second liner layer 220 may not be disposed under the interlayer insulting layer 700 and may be disposed under the gate insulating pattern 600 and spacer patterns 405. The second liner layer 220 may be defined as a second liner pattern which may extends from between the spacer patterns 405 and the active pattern AF to between the gate insulating pattern 600 and the active pattern AF. The second liner pattern 220P may extend along bottom surfaces of the gate insulating pattern 600 and spacer patterns 405 in the second direction D2. For example, the second liner pattern 220P may not be etched during the formation of the opening 450 as described with reference to FIGS. 7A and 7B. The second liner pattern 220P may be disposed between adjacent ones of the source/drain patterns 500 and may contact the source/drain patterns 500. The second liner pattern 220P may be provided as a gate insulating pattern. In some embodiments, the gate insulating pattern 600 may not be formed.

Figure 10A:
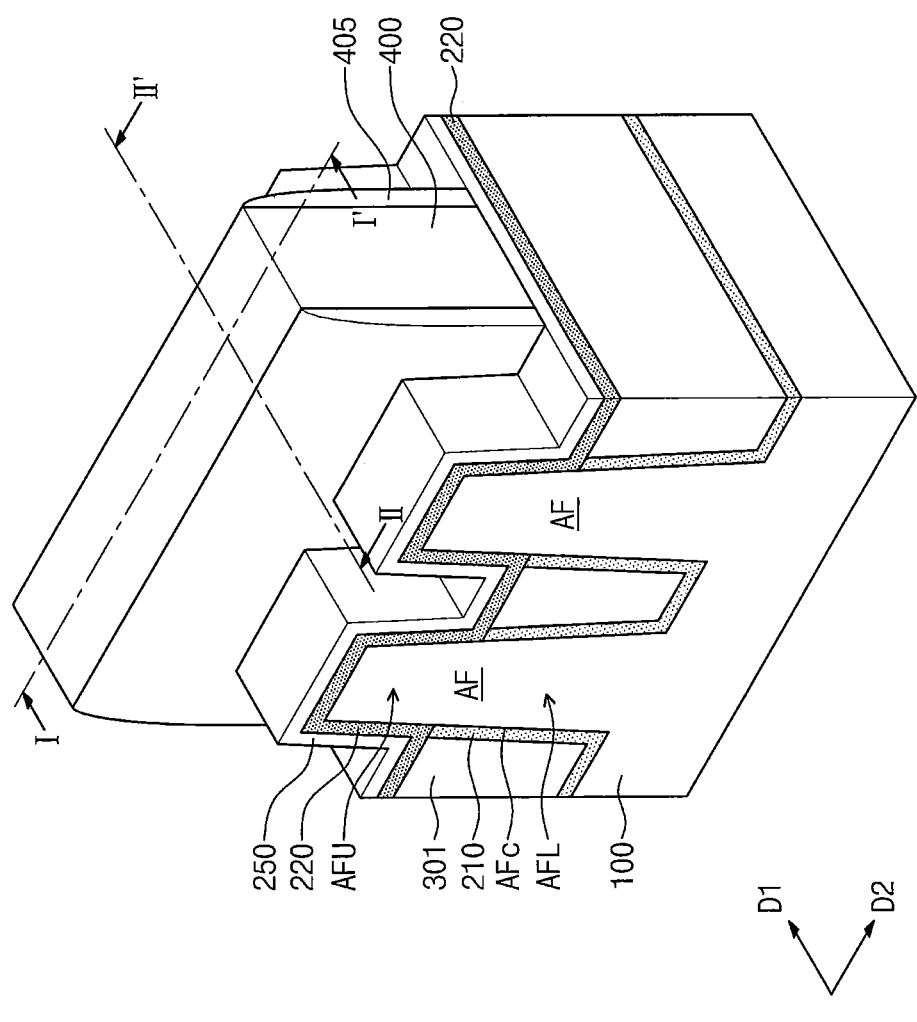
FIGS. 10A and 11A are perspective views illustrating a method of manufacturing a semiconductor device according to example embodiments of the inventive concepts.
Figure 10B:
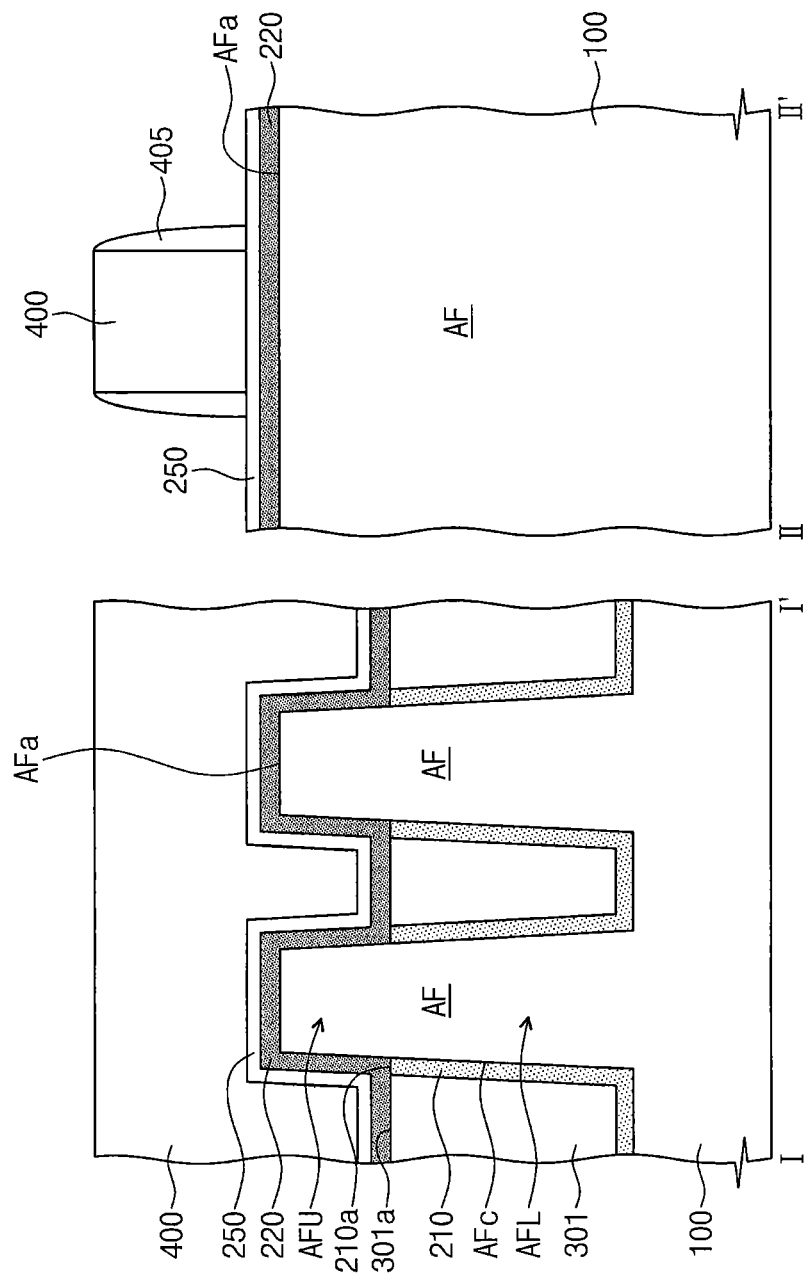
FIGS. 10B and 11B are cross-sectional views taken along lines I-I' and II-II' of FIGS. 10A and 11A, respectively.
Figure 11A:
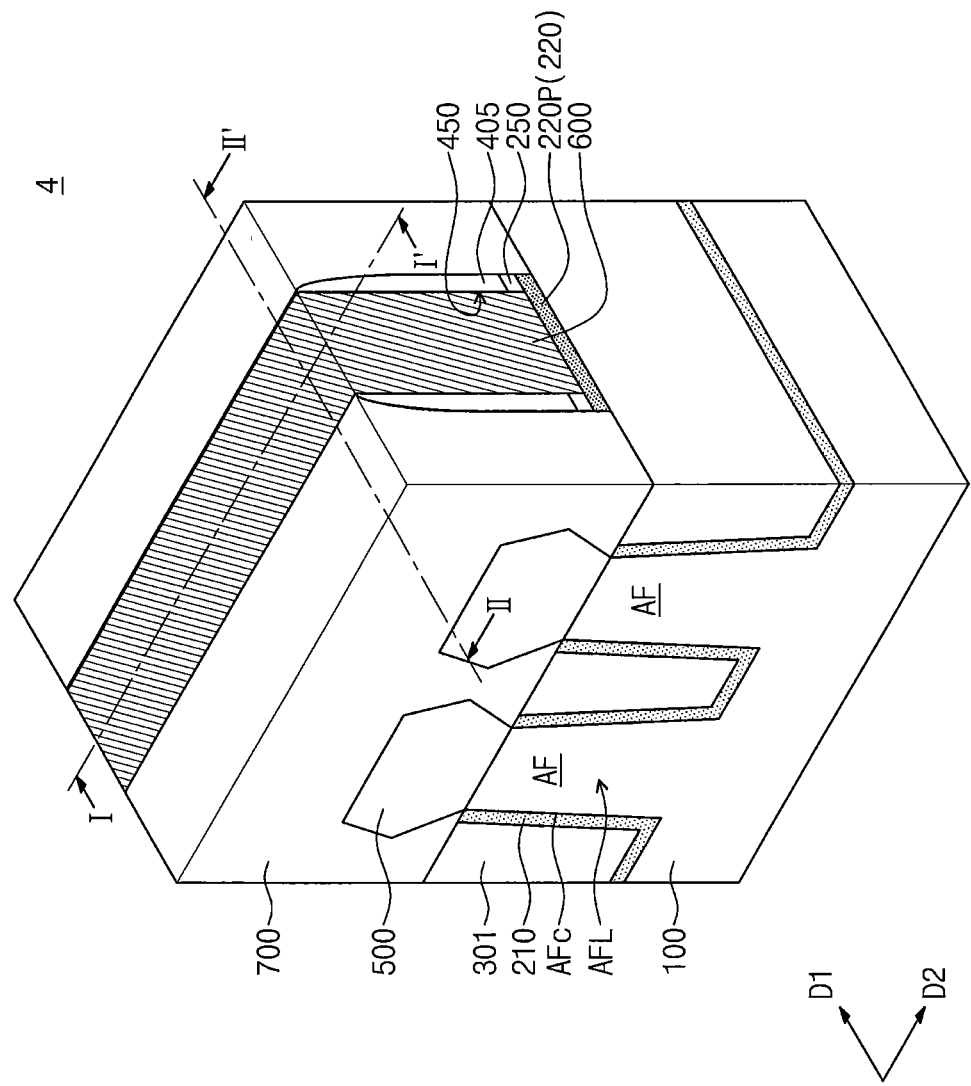
Figure 11B:
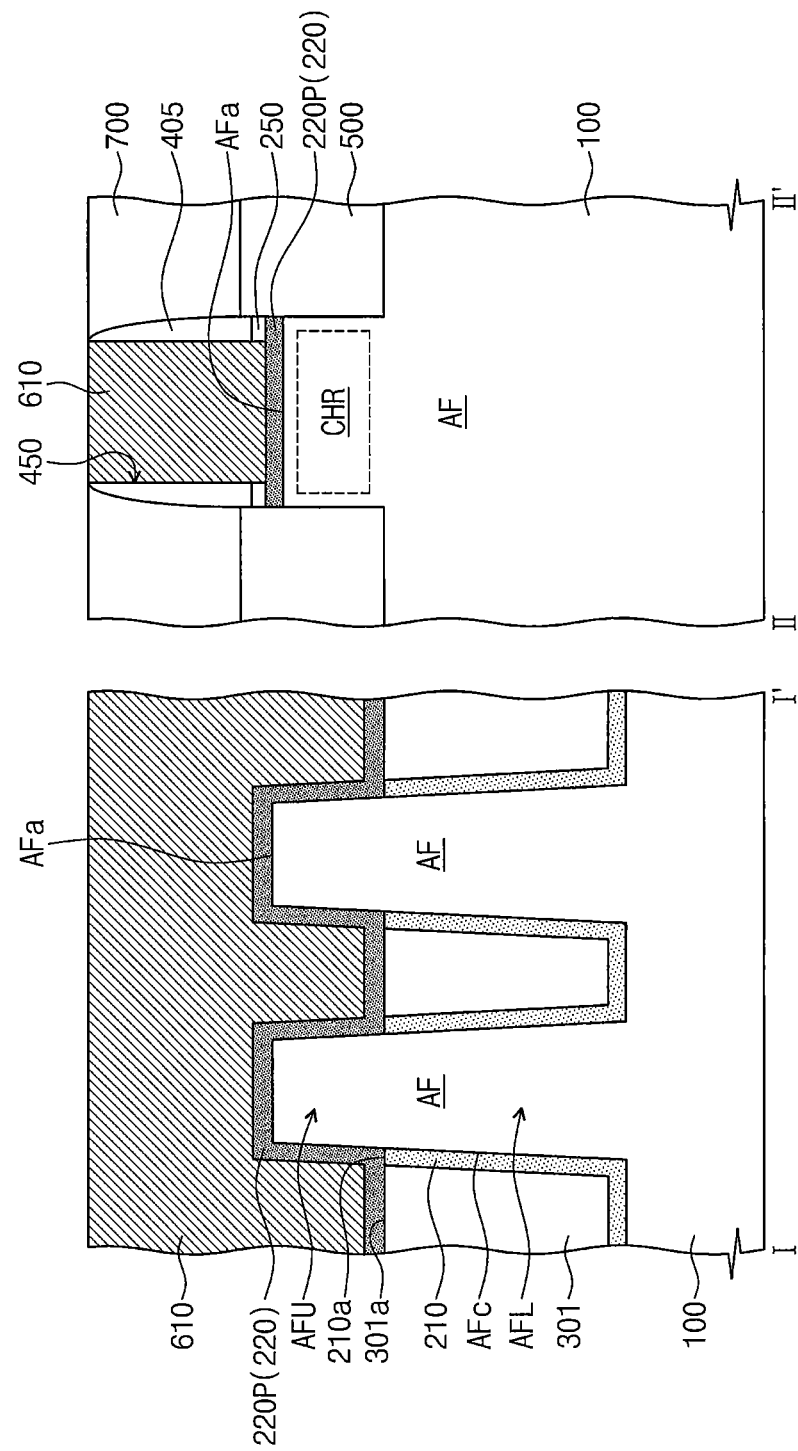

FIGS. 10A and 11A are perspective views illustrating a method of manufacturing a semiconductor device according to example embodiments of the inventive concepts. FIGS. 10B and 11B illustrate cross-sectional views taken along lines I-I' and II-II' of FIGS. 10A and 11B, respectively. Hereinafter, the descriptions to the same elements as described in the embodiments illustrated in FIGS. 1A to 7B will be omitted or mentioned briefly for the purpose of ease and convenience in explanation.

Referring FIGS. 10A and 10B, an active pattern AF, a first liner layer 210, a field isolation pattern 301, and a second liner layer 220 may be formed by processes similar to those described in FIGS. 1A to 4B. An etch stop layer 250 may be formed on the second liner layer 220 which may cover the active pattern AF and the field isolation pattern 301. The etch stop layer 250 may include silicon oxide. A dummy gate 400 may be formed on the etch stop layer 250. In the patterning process for forming the dummy gate 400, the second liner layer 220 at opposing sides of the dummy gate may not be etched due to the etch stop layer 250. Spacer patterns 405 may be formed on opposing sidewalls of the dummy gate 400.

Referring FIGS. 11A and 11B, the etch stop layer 250 and the second liner layer 220 may be etched using the spacer patterns 405 and the dummy gate 400 as etch masks. Thus, a portion of the second liner layer 220 which is not covered by the spacer patterns 405 and the dummy gate 400 may be removed to expose the active pattern AF. The exposed active pattern AF may be recessed and source/drain patterns 500 may be formed on the recessed active pattern AF. In some embodiments, source/drain patterns 500 may be formed on the active pattern AF which may be exposed by the second liner 220 and the etch stop layer 250 and may not be recessed. An interlayer insulating layer 700 may be formed on the field isolation pattern 301 at opposing sides of the dummy gate 400 of FIGS. 10A and 10B and may cover the source/drain patterns 500. The dummy gate 400 and the etch stop layer 250 may be removed to form an opening 450. Here, a portion of the etch stop layer 250 may remain under the spacer pattern 405. By the removal of the etch stop layer 250, the second liner layer 220 may be exposed. The second liner layer 220 may be defined as a second liner pattern 220P. The gate pattern 610 may cover the second liner pattern 220P and may be formed in the opening 450. For example, the gate pattern 610 may be on the second liner pattern 220P to fill at least a portion of the opening 450. The second liner pattern 220P may be provided as a gate insulating pattern. Thus, an additional gate insulating pattern may not be formed in the opening 450. As a result, the semiconductor device 4 may be fabricated by the above-described processes.

Figure 12A:
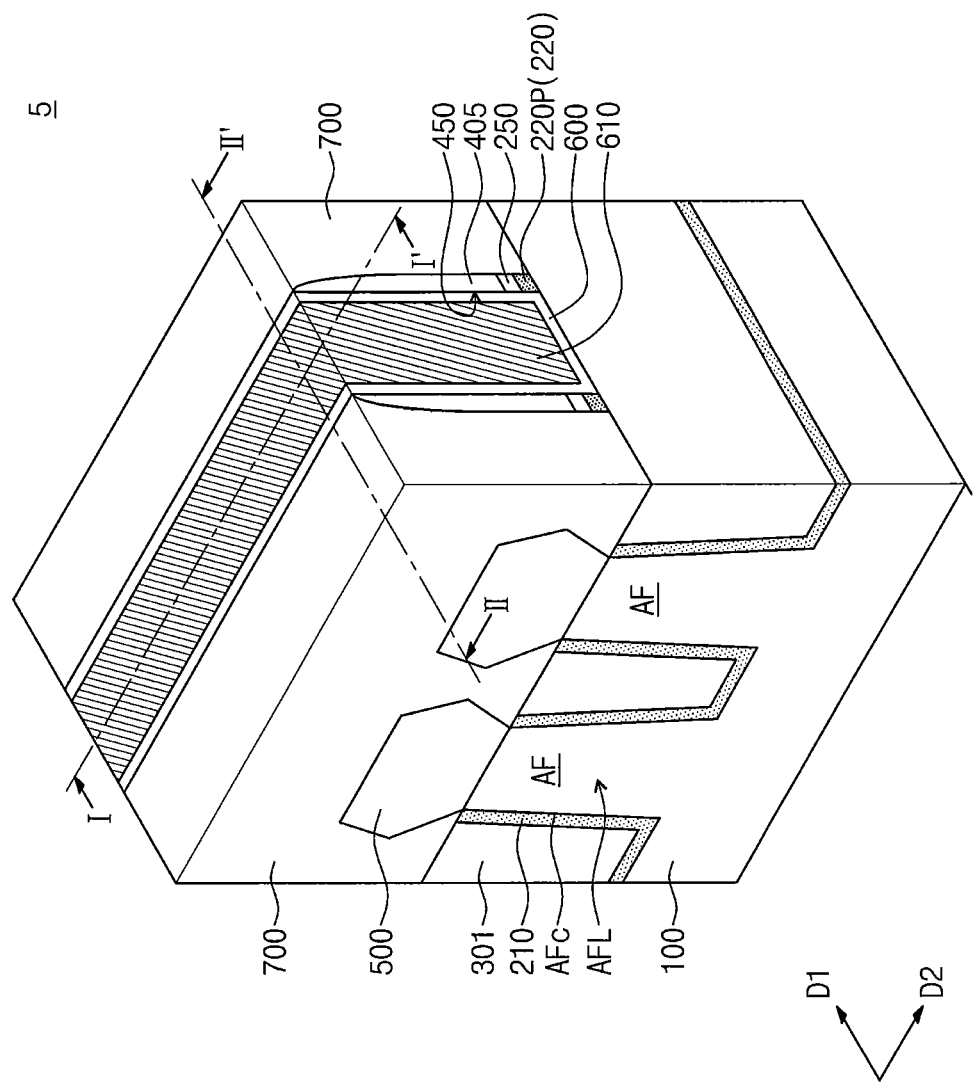
FIG. 12A is a perspective view illustrating a semiconductor device according to example embodiments of the inventive concepts.
Figure 12B:
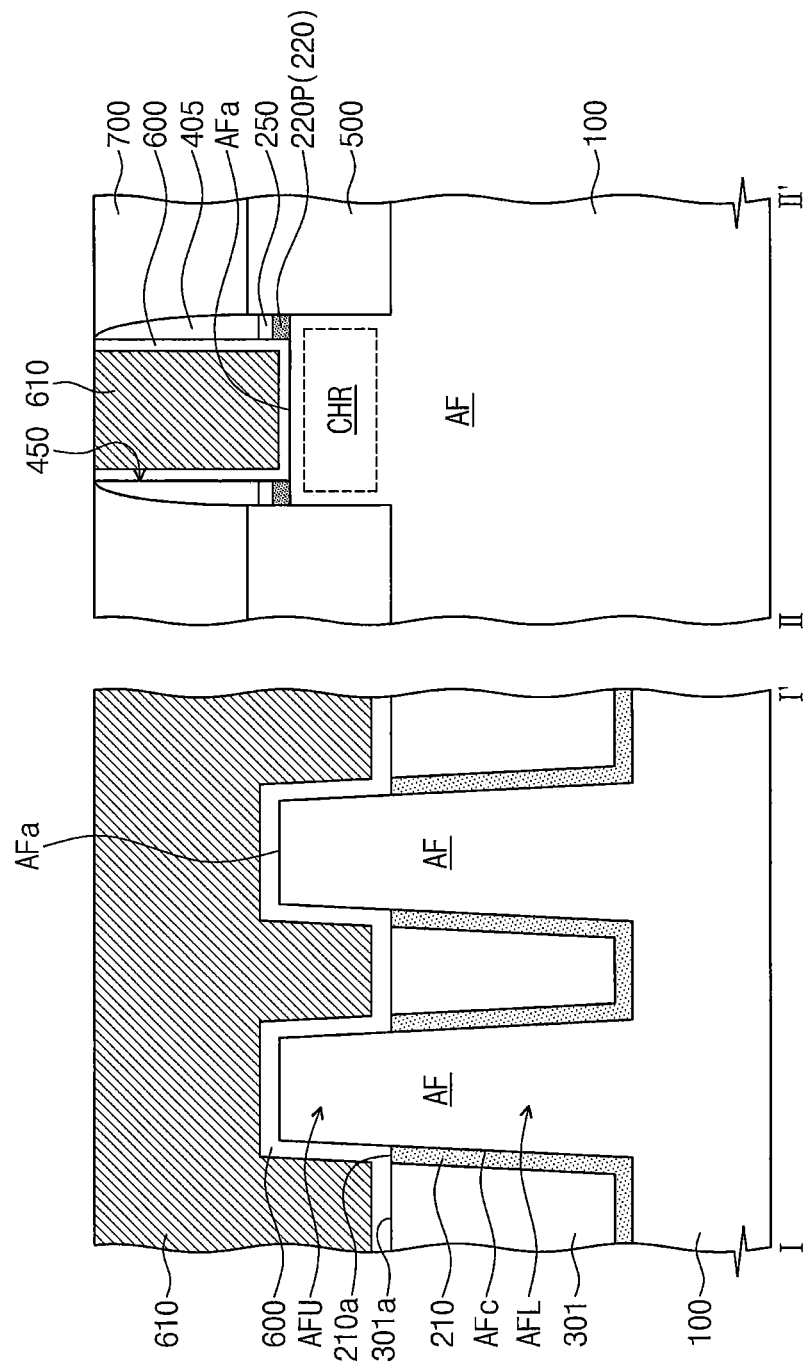
FIG. 12B is a cross-sectional view taken along lines I-I' and II-II' of FIG. 12A.

FIG. 12A is a perspective view illustrating a semiconductor device according to example embodiments of the inventive concepts. FIG. 12B is a cross-sectional view taken along lines I-I' and II-II' of FIG. 12A. Hereinafter, the descriptions to the same elements as described in the embodiments illustrated in FIGS. 1A to 7B will be omitted or mentioned briefly for the purpose of ease and convenience in explanation.

Referring FIGS. 12A and 12B, a semiconductor device 5 may include a substrate 100 including an active pattern AF, a first liner layer 210, a second liner layer 220, a field isolation pattern 301, source/drain patterns 500, a gate insulating pattern 600, a gate pattern 610, spacer patterns 405, and an interlayer insulating layer 700. The active pattern AF may include silicon-germanium, or germanium. The first liner layer 210 may be interposed between a lower portion AFL of the active pattern AF and the field isolation pattern 301. The second liner layer 220 may be not disposed under the gate pattern 600 but disposed under the spacer patterns 405 unlike the semiconductor 4 of FIGS. 11A and 11B. The second liner layer 220 may be defined as a second liner pattern 220 which may extend along with the etch stop layer 250 in the second direction D2. For example, the second liner layer 220 may be etched along with the etch stopper layer 250 after the removal of the dummy gate 400 as described with reference to FIGS. 11A and 11B. The gate insulating pattern 600 and the gate pattern 610 may be formed on the upper portion AFU of the active pattern AF and the field isolation pattern 301. The gate insulating pattern 600 and the gate pattern 610 may cross the active pattern AF and the field isolation pattern 310 and may extend in the second direction D2. The second liner layers 220 may include the same materials as those of the second liner layers 220 of the semiconductor device 1 of FIGS. 7A and 7B.

Figure 13:
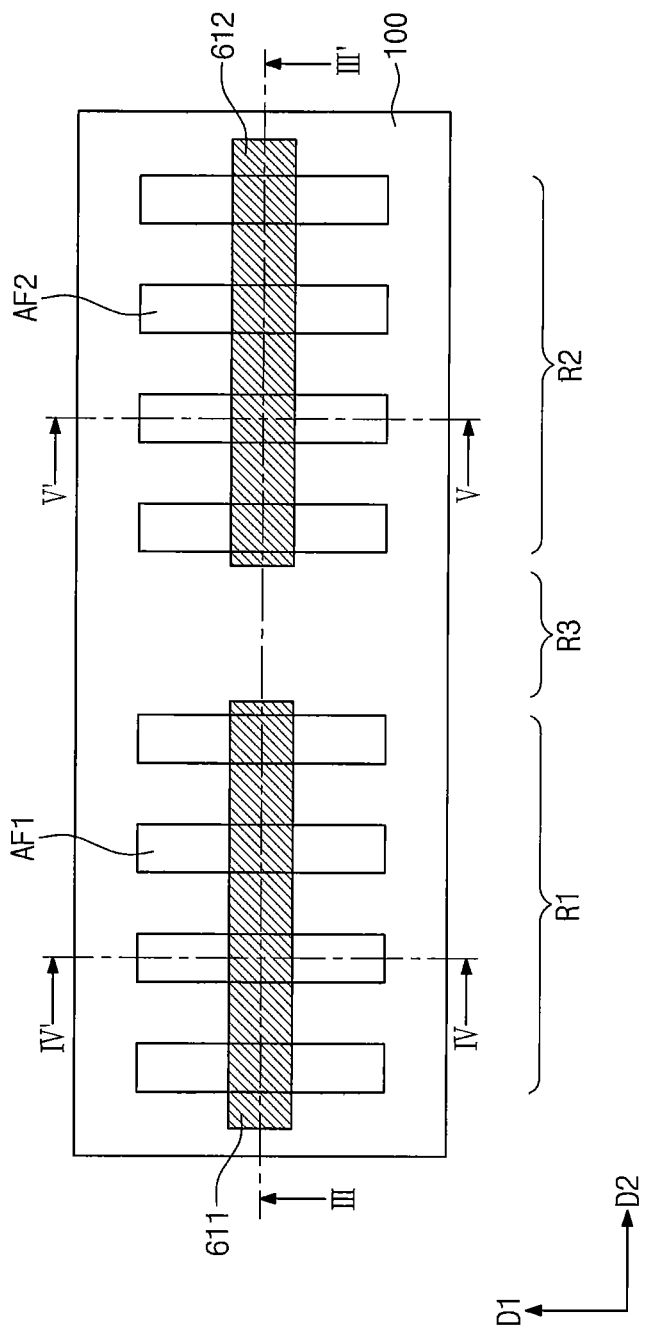
FIG. 13 is a plan view illustrating a semiconductor device according to example embodiments of the inventive concepts.

FIG. 13 is a plan view illustrating a semiconductor device according to example embodiments of the inventive concepts. FIGS. 14A to 14F are cross-sectional views illustrating a method of manufacturing a semiconductor device according to example embodiments of the inventive concepts. FIGS. 14A to 14F illustrate cross-sectional views taken along lines IV-IV', and V-V' of FIG. 13, respectively.

Figure 14A:
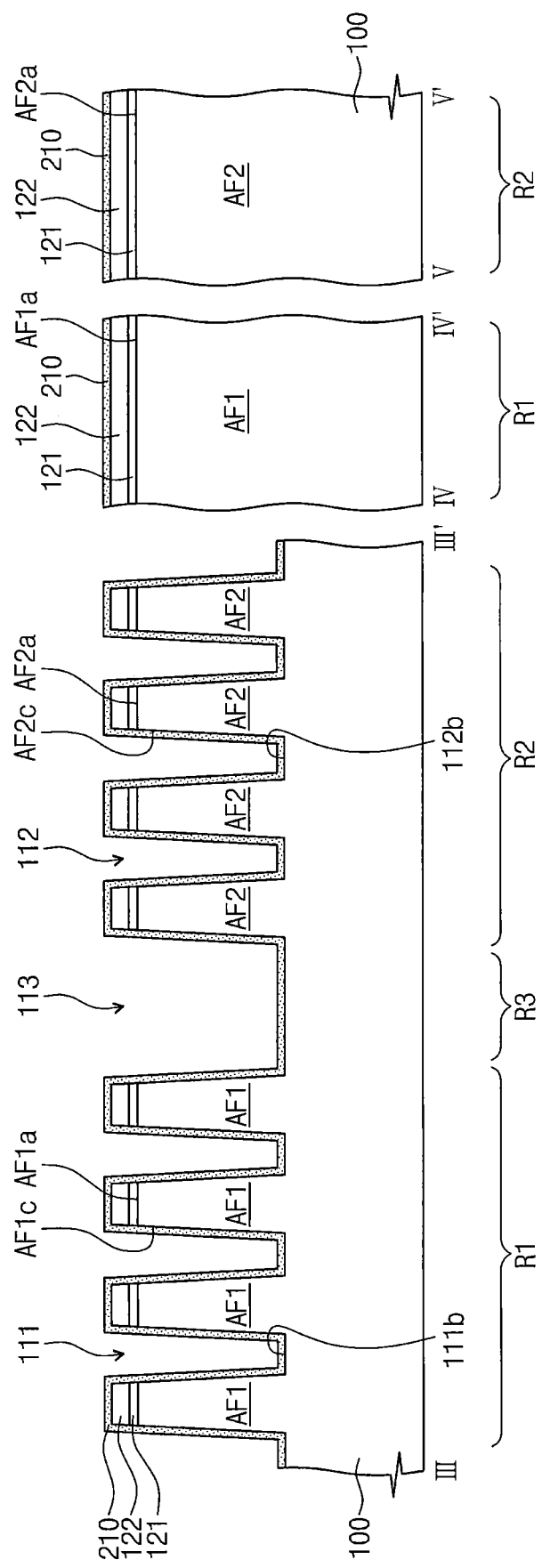
FIGS. 14A to 14F are cross-sectional views illustrating a method of manufacturing a semiconductor device according to example embodiments of the inventive concepts.

Referring to FIGS. 13 and 14A, a substrate 100 including a first region R1, a second region R2, and a third region R3 may be provided. The third region R3 may be provided between the first region R1 and the second region R2. A first active pattern AF1 and a second active pattern AF2 may be formed in the first region R1 and the second region R2, respectively. The first and second active patterns AF1 and AF2 may protrude from the substrate 100. The first and second active patterns AF1 and AF2 may be fin-type active patterns. The first and second active patterns AF1 and AF2 may extend in a first direction D1 parallel to a bottom surface of the substrate 100. The first and second active patterns AF1 and AF2 may be provided in plural on the first and second regions R1 and R2, respectively. For example, a plurality of the first active patterns AF1 and a plurality of the second active patterns AF2 may be arranged in a second direction D2 across the first direction D1 the first and second regions R1 and R2. The second direction D2 may be parallel to the bottom surface of the substrate. The first pattern AF1 may include a germanium content higher than that of the second active pattern AF2. The first active pattern AF1 may include silicon-germanium or germanium. The second active pattern AF2 may include silicon, silicon-germanium, or a III-V semiconductor compound.

The first active pattern AF1 and second active pattern AF2 may be defined by a first trench 111 and a second trench 112 formed in the substrate 100, respectively. Here, the first and the second trenches 111 and 112 may be formed by etching the substrate 100 exposed by first and second mask patterns 121 and 122, respectively. The substrate 100 of the third region R3 may be etched to form a third trench 113. As an example, the first mask pattern 121 may include silicon oxide and the second mask pattern 122 may include silicon nitride. However, the inventive concepts are not limited thereto.

The first liner layer 210 may be formed on the substrate 100 having the first to third trenches 111, 112, and 113 therein. The first liner layer 210 may cover side surfaces AF1c and AF2c and top surfaces AF1a and AF2a of the first and second active patterns AF1 and AF2. The first liner layer 210 may cover bottom surfaces 111b and 112b of the first and second trenches 111 and 112, and an inner wall of the third trench 113. The first liner layer 210 may be formed by processes similar to the processes of forming the first liner layer 210 described with reference to FIGS. 1A and 1B.

Figure 14B:
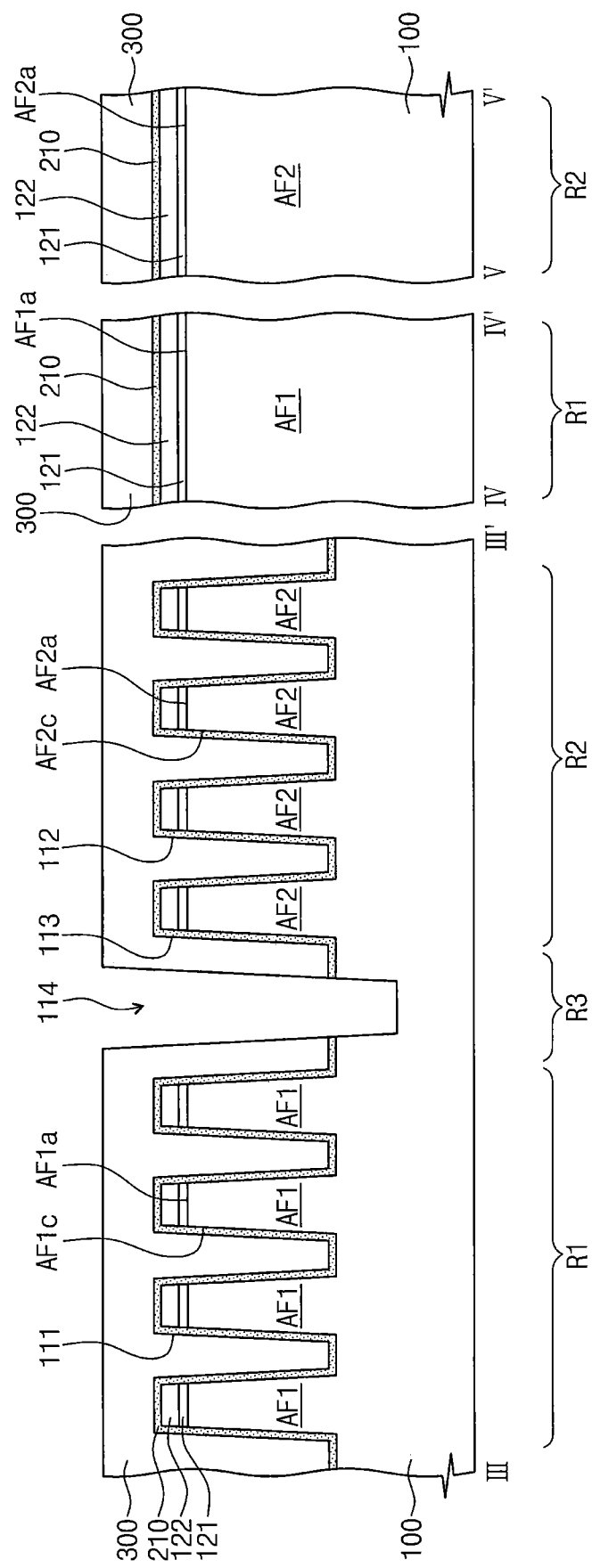

Referring to FIGS. 13 and 14B, a field isolation insulating layer 300 may be formed on the first liner layer 210. The field isolation insulating layer 300 may completely fill the first and second trench 111 and 112 and may partially fill the third trench 113. The field isolation insulating layer 300 may be formed using a deposition process or a coating process and may include oxide. The first liner layer 210 may possibly prevent the first and second active patterns AF1 and AF2 from being damaged (e.g., oxidation) while the field isolation insulating layer 300 may be formed.

A fourth trench 114 may be formed in the third region R3 of the substrate 100. The fourth trench 114 may be formed by etching the field isolation insulating layer 300, the first liner layer 210, and the substrate 100 of the region R3. The fourth trench 114 may be more deeply formed into the substrate 100 than the first and second trenches 111 and 112.

Figure 14C:
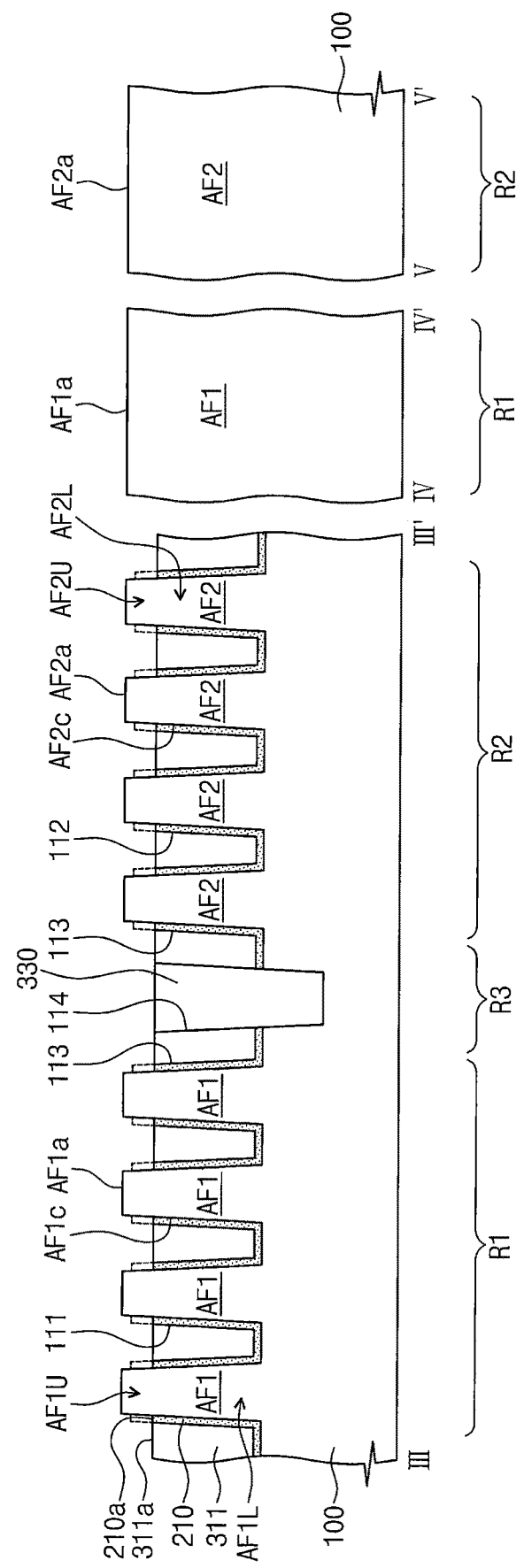

Referring to FIGS. 13 and 14C, a second field isolation pattern 330 may be formed on the third region R3 by filling the fourth trench 114 with an insulating layer. The second field isolation pattern 330 may include the field insulating layer 300 in the third trench 113. The second field isolation pattern 330 may separate the first region R1 to the second region R2. For example, the first active pattern AF1 and the second active pattern AF2 may be separated by the second field isolation pattern 330.

A first field isolation pattern 311 may be formed by etching the field isolation insulating layer 300 until upper portions AF1U and AF2U of the first and second active patterns AF1 and AF2 may be exposed. The first and second mask patterns 121 and 122 and a portion of the first liner layer 210 may be etched when the insulating layer is etched. The first liner layer 210 may be further etched until an upper surface 210a of the first liner layer 210 may be positioned at substantially the same level or a lower level than an upper surface 210a of the first field isolation pattern 311. In some embodiments, when the field isolation insulating layer 300 is etched, the first liner layer 210 also may be etched so that the upper surface 210a of the first liner layer 210 may be positioned at substantially the same level or a lower level than the upper surface 210a of the first field isolation pattern 311, and thus an additional etching process of the first liner layer 210 may be omitted. The upper portions AF1U and AF2U of the first and second active patterns AF may be exposed by the first liner layer 210. Lower portions AF1L and AF2L of the first and second active patterns AF may be covered by the first liner layer 210. In some embodiments, when the field isolation insulating layer 300 is etched, the insulating layer for the second field isolation pattern 330 may be etched.

Figure 14D:
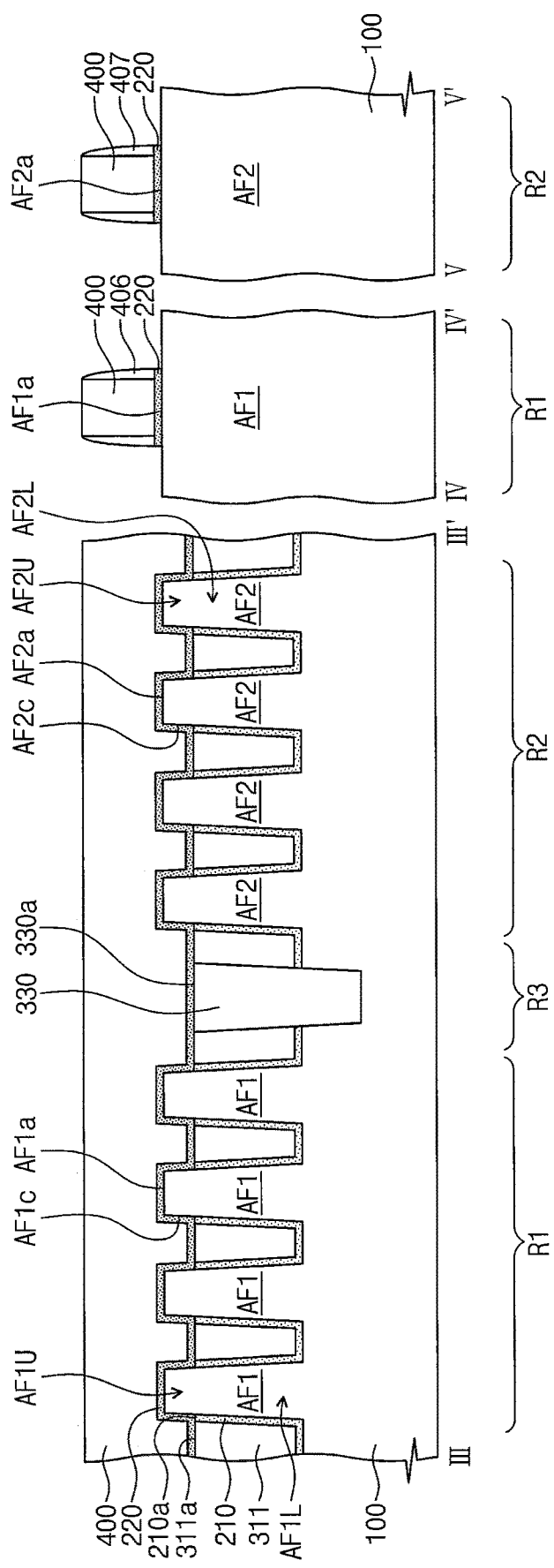

Referring to FIGS. 13 and 14D, a second liner layer 220 may be formed on the first to third regions R1, R2, and R3 of the substrate 100. The second liner layer 220 may be formed on the side surfaces AF1c and AF2c and top surfaces AF1a and AF2a of the upper portions AF1U and AF2U of the first and second active patterns AF1 and AF2, the first field isolation pattern 311 and the second field isolation pattern 330. In some embodiments, the second liner layer 220 may include nitride containing silicon. The second liner layer 220 may include, for example, SiN, SiCN, SiBN, and/or SiCBN. The second liner layer 220 may not include oxygen. In some embodiments, the second liner layer 220 may include a high-k dielectric material. The high-k dielectric material for the second liner layer 220 may be a material having a dielectric constant greater than the dielectric constant of silicon nitride. The second liner layer 220 may include, for example, $Al_2O_3$, $ZrO_2$, $La_2O_3$, $HfO_2$, HfAlO, HfLaO, TaO, $Ta_2O_5$, TiO, $TiO_2$, $La_2O_3$, $Y_2O_3$, $SrTiO_3$, $LaAlO_3$, $Y_2O_3$, HfON, ZrON, $La_2ON$, $Al_2ON$, TiON, SrTiON, LaAlON, $Y_2ON$, and/or a silicate thereof A dummy gate 400 may be formed on the first and second regions R1 and R2 of the substrate 100. A formation of the dummy gate 400 may include forming a dummy gate layer on the substrate 100 and patterning the dummy gate layer. The dummy gate 400 may include, or example, poly-silicon. In some embodiments, the dummy gate 400 may include a poly-silicon pattern and a capping layer pattern thereon. The capping pattern may include oxide and/or nitride. The second liner layer 220 may possibly prevent the first and second active patterns AF1 and AF2 from being damaged (e.g., being oxidized) during the formation of the dummy gate 400. First and second spacer patterns 406 and 407 may be formed on opposing sidewalls of the dummy gate 400. The first spacer patterns 406 may be disposed on the first region R1 and the second spacer patterns 407 may be disposed on the second region R2. A portion of the second liner layer 220 which may be exposed by the dummy gate 400 and the first and second spacer patterns 406 and 407 may be removed. For example, a portion of the second liner layer 220 under the first and second spacer patterns 406 and 407 and the dummy gate 400 may remain but other portion of the second liner layer 220 may be removed. The remaining second liner layer 220 may extend in the second direction D2 and may be provided on the side surfaces AFc and the top surfaces AFa of the upper portions AF1U and AF2U of the first and second active patterns AF1 and AF2, the top surface 311a of the first field isolation pattern 311, and the top surface 330a of the second field isolation pattern 330 under the dummy gate 400 and the first and second spacer patterns 406 and 407.

Figure 14E:
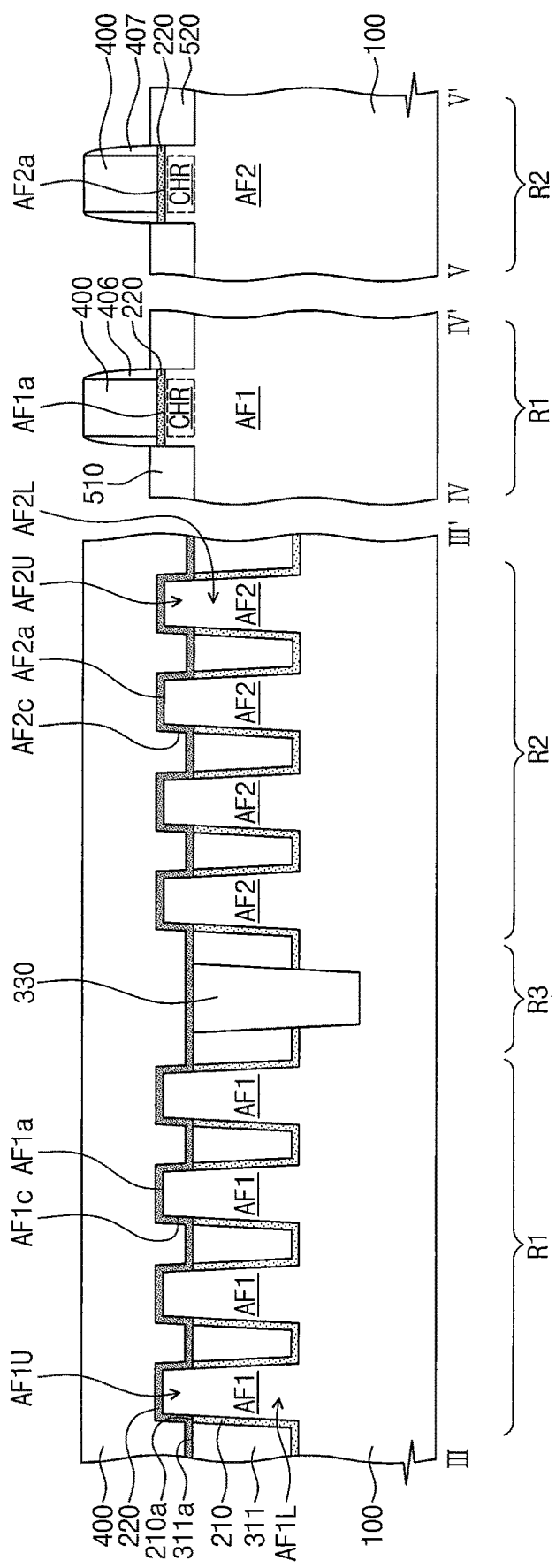

Referring to FIGS. 13 and 14E, first and second source/drain patterns 510 and 520 may be formed on the first and second active pattern AF1 and AF2 on the first and second regions R1 and R2, respectively. In some embodiments, the formation of the first and second source/drain patterns 510 and 520 may include recessing the first and second active patterns AF1 and AF2 at opposing sides of the dummy gate 400 (e.g., adjacent the first and second spacer patterns 406 and 407) and forming epitaxial layers on the recessed first and second active patterns AF1 and AF2. In some embodiments, the formation of the first and second source/drain patterns 510 and 520 may include forming epitaxial layers on the first and second active patterns AF1 and AF2, which may not be recessed, at opposing sides of the dummy gate 400 (e.g., adjacent the first and second spacer patterns 406 and 407). The epitaxial layers may be formed using, for example, a selective epitaxial growth (SEG) process. The first source/drain patterns 510 may have a germanium content higher than that of the first active pattern AF1. Thus, the first source/drain patterns 510 may induce a compressive strain in a channel region CHR of the first active pattern AF1. The channel region CHR of the first active pattern AF1 may be defined as a region between adjacent respective ones of the first source/drain patterns 510. The first source/drain patterns 510 may be doped with p-type dopants. The second source/drain patterns 520 may induce a tensile strain in a channel region CHR of the second active pattern AF2. The channel region CHR of the second active pattern AF2 may be defined as a region between adjacent ones of the second source/drain region 520. The second source/drain patterns 520 may include, for example, silicon carbide (SiC). The second source/drain patterns 520 may be doped with n-type dopants.

Figure 14F:
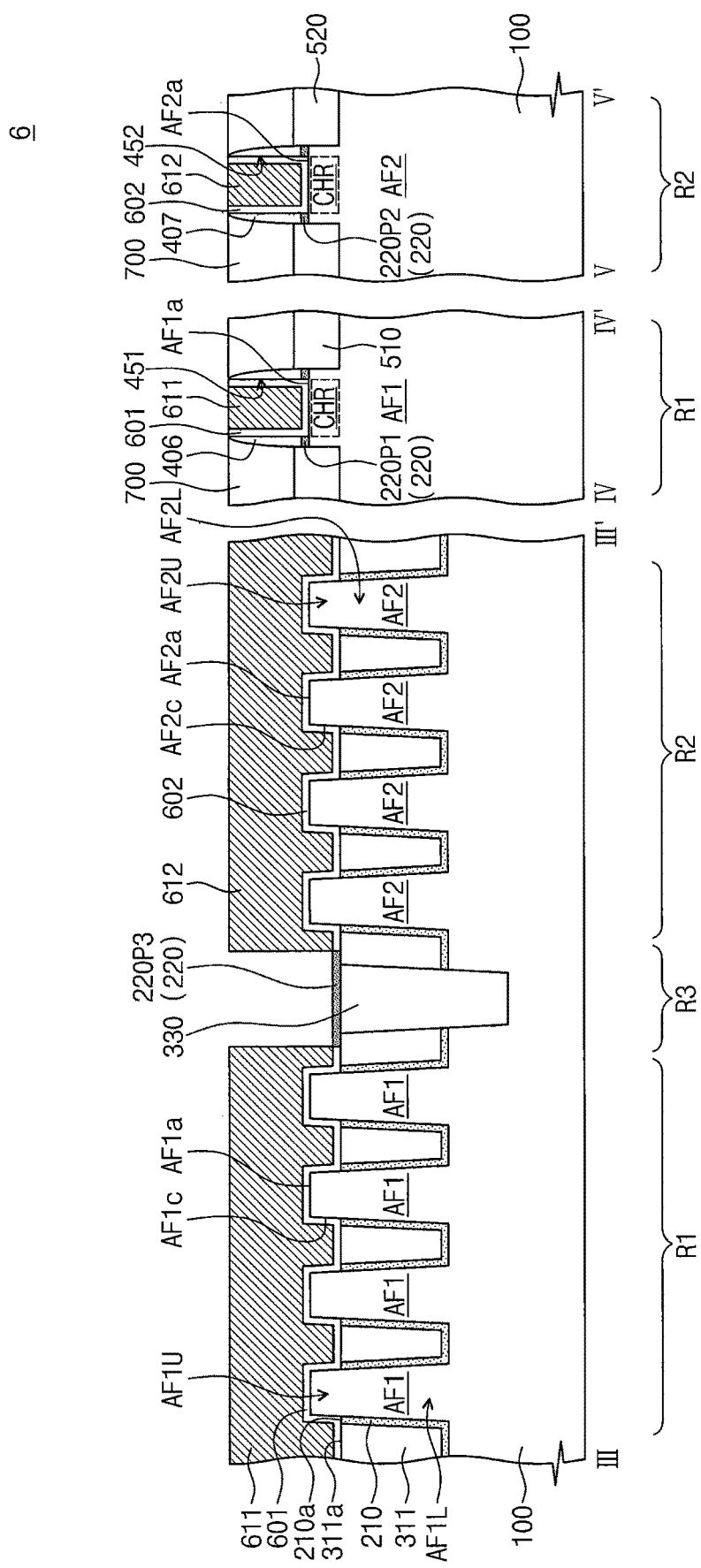

Referring to FIGS. 13 and 14F, an interlayer insulating layer 700 may be formed on the substrate 100 to cover the first and second source/drain patterns 510 and 520. Next, the dummy gate 400 of FIG. 14E on the first region R1 may be removed and a portion of the second liner layer 220 under the dummy gate 400 may be removed. Thus, a first opening 451 may be formed in the interlayer insulating layer 700. The first opening 451 may expose the top surface AF1$a$ and the side surfaces AF1$c$ of the upper portion AF1U of the first active pattern AF1. A first gate insulating pattern 601 and a first gate pattern 611 may formed on the top surface AF1$a$ and the side surfaces AF1$c$ of the upper portion AF1U of the first active pattern AF1 in the first opening 451. The first gate insulating pattern 601 and a second gate pattern 611 may cross the upper portion AF1U of the first active pattern AF1 and the first field isolation pattern 311 and may extend in the second direction D2. The first gate insulating pattern 601 may cover a bottom surface and sidewalls of the first gate pattern 611. The first spacer patterns 406 may disposed on opposing sidewalls of the first gate pattern 611 and the first gate insulating pattern 601 may be interposed between the first spacer pattern 406 and the first gate pattern 611. While the first gate insulating pattern 601 and the first gate pattern 611 are formed, a first mask may cover the second and third regions R2 and R3 of the substrate 100.

In the second region R2 of the substrate 100, the dummy gate 400 may be removed and a portion of the second liner layer under the dummy gate 400 may be removed. Thus, a second opening 452 may be formed in the interlayer insulating layer 700. The second opening 452 may expose the top surface AF2$a$ and the side surfaces AF2$c$ of the upper portion AF2U of the second active pattern AF2. A second gate insulating pattern 602 and a second gate pattern 612 may be formed on the top surface AF2$a$ and the side surfaces AF2$c$ of the upper portion AF2U of the second active pattern AF2 in the second opening 452. The second gate insulating pattern 602 and a second gate pattern 612 may cross the upper portion AF2U of the second active pattern AF2 and the first field isolation pattern 311 and may extend in the second direction D2. The second gate insulating pattern 602 may cover a bottom surface and sidewalls of the second gate pattern 612. The second spacer patterns 407 may be disposed on opposing sidewalls of the second gate pattern 612 and the second gate insulating pattern 602 may be interposed between the second spacer patterns 407 and the second gate pattern 612. While the second gate insulating pattern 602 and the second gate pattern 612 are formed, the first and third regions R1 and R3 of the substrate 100 may be covered by a second mask. The third region R3 of the substrate 100 may not be exposed during the formation of the first and second gate patterns 611 and 612, so the second liner layer 220 may remain on the second field isolation pattern 330 on the third region R3 of the substrate 100. In some embodiments, the dummy gate 400 on the third region R3 may be removed.

The second liner layer 220 may not be provided between the interlayer insulating layer 700 and the first field isolation pattern 311 on the first and second regions R1 and R2 of the substrate 100, like the second liner layer 220. In some embodiments, the second liner layer 220 may be provided between the interlayer insulating layer 700 and the second field isolation pattern 330 on the third region R3 of the substrate 100 as illustrated in FIGS. 8A and 8B. Further, the second liner layer 220 may be disposed under the first and second spacer patterns 406 and 407. As a result, the second liner layer 220 under the first spacer patterns 406 on the first region R1 may be defined as a first liner part 220P1, the second liner layer 220 under the second spacer patterns 407 on the first region R1 may be defined as a second liner part 220P2, and the second liner layer 220 on the second field isolation pattern 330 on the first region R1 may be defined as a third liner part 220P3.

The first liner parts 220P1 may be patterns, each of which may be self-aligned to a respective one of the first spacer patterns 406. That is, each of the first liner parts 220P1 may have sidewalls aligned to the sidewalls of each of the first spacer patterns 406. The first liner part 220P1 may be disposed between the first spacer patterns 406 and the first active pattern AF1 and between the first spacer patterns 406 and the first field isolation pattern 311 on the first region R1. The first liner part 220P1 may extend in the second direction D2 along with the first spacer patterns 406. The first liner part 220P1 may contact the first source/drain patterns 510.

The second liner parts 220P2 may be patterns, each of which may be self-aligned to a respective one of the second spacer patterns 407. That is, each of the second liner parts 220P2 may have sidewalls aligned to the sidewalls of each of the second spacer patterns 407. The second liner part 220P2 may be disposed between the second spacer patterns 407 and the second active pattern AF2 and between the second spacer patterns 407 and the first field isolation pattern 311 on the second region R2. The second liner part 220P2 may extend in the second direction D2 together with the second spacer patterns 407. The second liner part 220P2 may contact the second source/drain patterns 520.

In some embodiments, the second liner layer 220 may be not provided between the first field isolation pattern 311 and the interlayer insulating layer 700 on the first, second and third regions R1, R2 and R3 of the substrate 100.

In some embodiments, the second liner layer 220 (e.g., first and second liner parts 220P1 and 220P2) on the first and second regions R1 and R2 may be provided with structures similar to the structures as that of at least one of the second liner layer 220 of the semiconductor device 3 described with reference with FIGS. 9A and 9B, the second liner layer 220 of the semiconductor device 4 described with reference with FIGS. 11A and 11B, and the second liner layer 220 of the semiconductor device 5 described with reference with FIGS. 12A and 12B. A semiconductor device 6 may be fabricated according to above-described processes.

Figure 15:
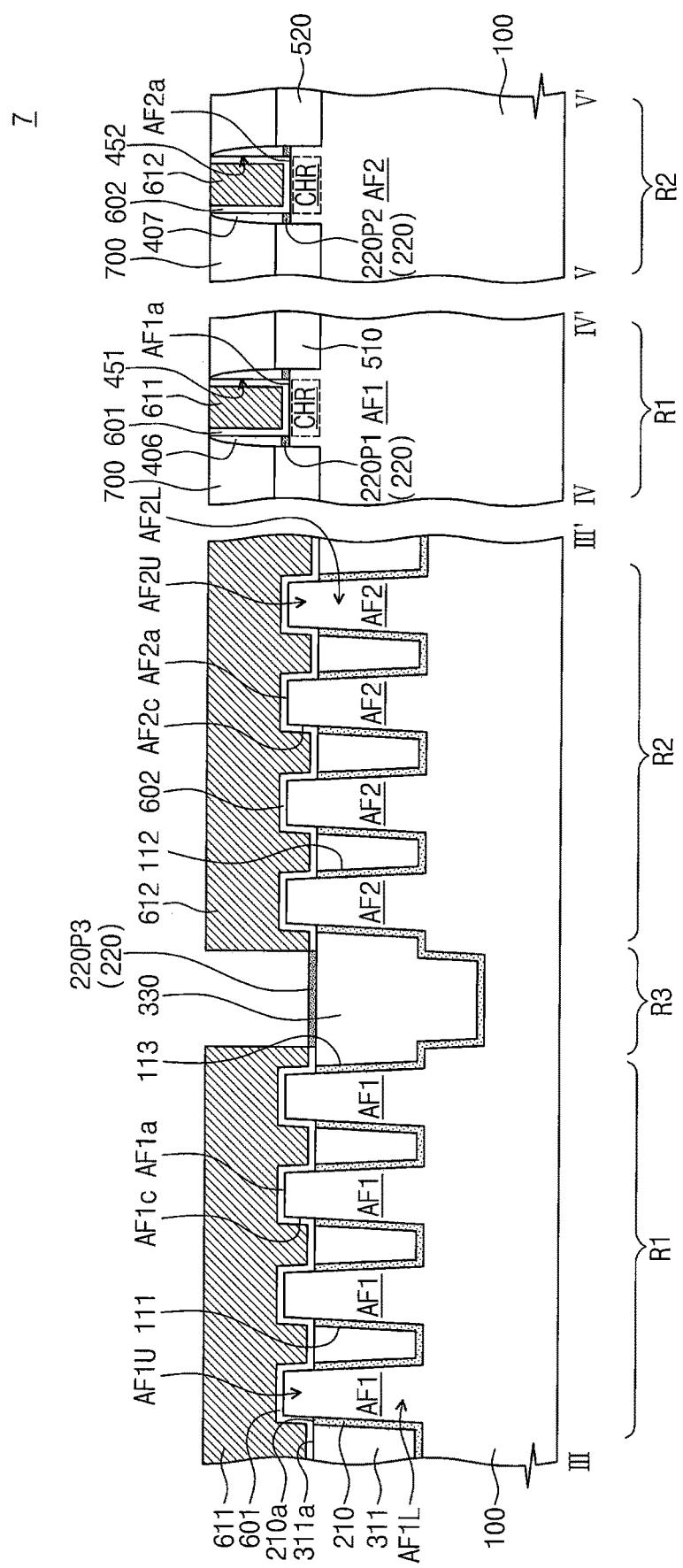
FIG. 15 is a cross-sectional view taken along lines III-III', IV-IV', and V-V' of FIG. 13 to illustrate a semiconductor device according to example embodiments of the inventive concepts.

FIG. 15 is a cross-sectional view taken along lines III-III', IV-IV', and V-V' of FIG. 13 to illustrate a semiconductor device according to example embodiments of the inventive concepts. Hereinafter, the descriptions to the same elements as described in the embodiments illustrated in FIGS. 14A to 14F will be omitted or mentioned briefly for the purpose of ease and convenience in explanation.

Referring to FIGS. 13 and 15, a semiconductor device 7 may include a substrate 100 including a first to third regions R1, R2, and R3, a first field isolation pattern 311, and an interlayer insulating layer 700. A first trench 111, a first active pattern AF1, first source/drain patterns 510, a first gate insulating pattern 601, and a first gate pattern 611 may be provided on the first region R1 of the substrate 100. A second trench 112, a second active pattern AF2, second source/drain patterns 520, a second gate insulating pattern 602, and a second gate pattern 612 may be provided on the second region R2 of the substrate 100. A second field isolation pattern 330 may be formed in a third trench 113 on the third region R3 of the substrate 100.

The first liner layer 210 may further be provided in the third trench 113 unlike the first liner layer 210 of the semiconductor device 6 of FIG. 14F. The first liner layer 210 may be interposed between the second field isolation pattern 330 and the substrate 100. As an example, before the first field isolation pattern 311 and the second field isolation pattern 330 are formed, the first liner layer 210 may be formed in the first, second, and third trenches 111, 112, and 113. The second liner layer 220 may be provide on the first to third regions R1, R2, and R3 like the second liner layer 220 of the semiconductor device 6 of FIG. 14F.

Figure 16:
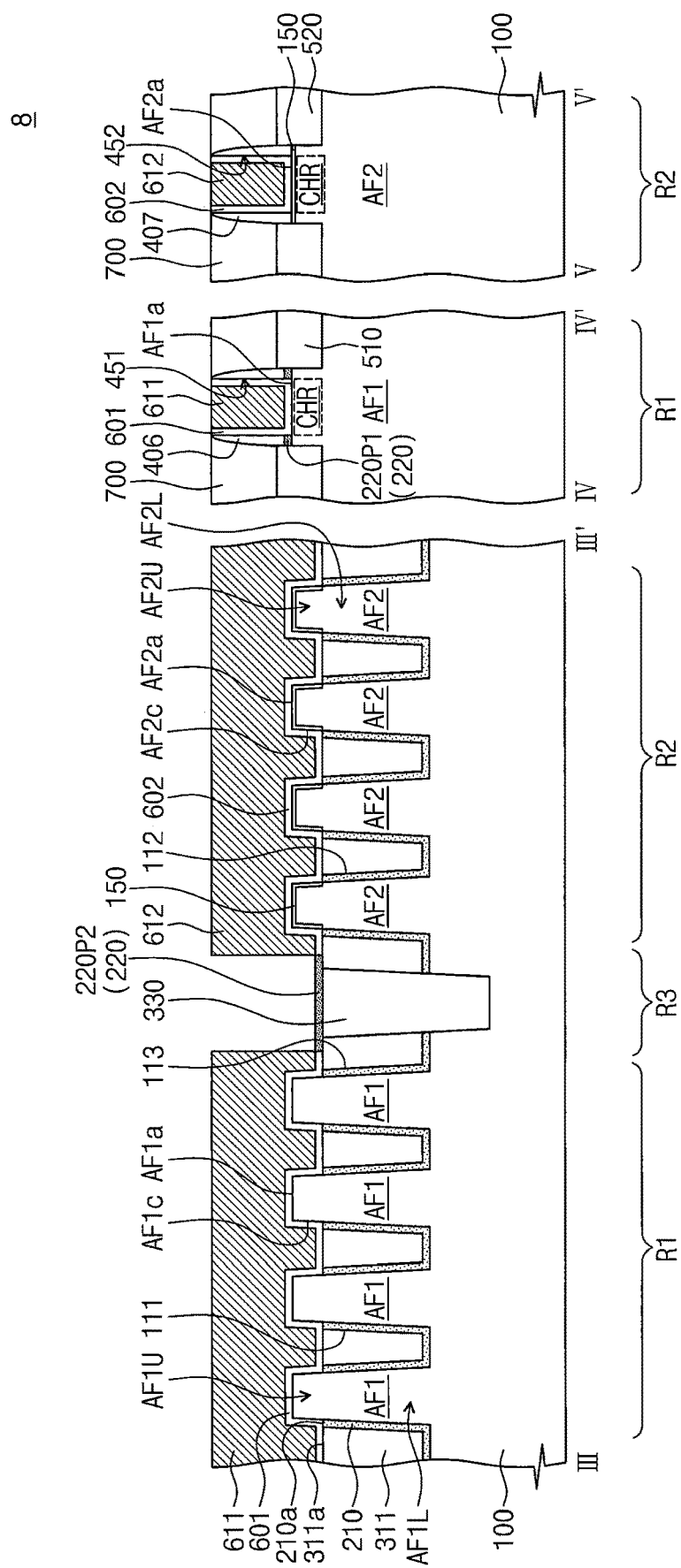
FIG. 16 is a cross-sectional view taken along lines III-III', IV-IV', and V-V' of FIG. 13 to illustrate a semiconductor device according to example embodiments of the inventive concepts.

FIG. 16 is a cross-sectional view taken along lines III-III', IV-IV', and V-V' of FIG. 13 to illustrate a semiconductor device according to example embodiments of the inventive concepts. Hereinafter, the descriptions to the same elements as described in the embodiments illustrated in FIGS. 14A to 14F will be omitted or mentioned briefly for the purpose of ease and convenience in explanation.

Referring to FIGS. 13 and 16, a semiconductor device 8 may include a substrate 100 include a first, second, and third regions R1, R2, and R3, a first field isolation pattern 311, and an interlayer insulating layer 700. A first trench 111, a first active pattern AF1, a first gate insulating pattern 601, and a first gate pattern 611 may be provided on the first region R1 of the substrate 100. The first active pattern AF1 may be provided in plural on the first region R1. For example, a plurality of the first active patterns AF1 may be arranged in a second direction D2 on the first region R1. The first active pattern AF1 may include silicon-germanium or germanium. The first source/drain patterns 510 may be provided on the first active pattern AF1 and may include a material applying a compressive strain to a channel region CHR of the first active pattern AF1 between the adjacent ones of the first source/drain patterns 510. The first source/drain patterns 510 may include germanium. A second trench 112, a second active pattern AF2, a second gate insulating pattern 602, and a second gate pattern 612 may be provided on the second region R2 of the substrate 100. The second active patterns AF2 may be provided in plural on the second region R2. For example, a plurality of the second active patterns AF2 may be arranged in a second direction D2 on the second region R2. The second active pattern AF2 may include silicon, silicon-germanium, or III-V compound semiconductor material. Here, the semiconductor material may include, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

The second source/drain patterns 520 may be provided on the second active pattern AF2 and include a material applying a tensile strain to a channel region CHR of the second active pattern AF2 between the adjacent ones of the second source/drain patterns 520. The second source/drain patterns 520 may include silicon carbide. A second field isolation pattern 330 may be formed on the third region R3 of the substrate 100 to fill a third trench 113 and a fourth trench 114.

A first liner layer 210 may be interposed between the first and second active patterns AF1 and AF2 and the first field isolation patterns 311.

A second liner layer 220 (e.g., first liner parts 220P1) may be interposed between the first spacer patterns 406 and an upper portion AF1U of the first active pattern AF1 on the first region R1 of the substrate 100. The second liner layer 220 may not be provided on the second region R2 of the substrate 100. For example, the second liner layer 220 may be formed on the first to third regions R1, R2, and R3 of the substrate 100 to cover the first and second active pattern AF1 and AF2. The second liner layer 220 on the second region R2 of the substrate 100 may be selectively removed, and thus side surfaces AF2c and a top surface AF2a of an upper portion AF2U of the second active pattern AF2 may be exposed. The upper portion AF2U of the second active pattern AF2 may be oxidized to form an oxide layer 150 on the second active pattern AF2. The oxide layer 150 may include, for example, silicon oxide, silicon-germanium oxide, or III-V semiconductor compound oxide. Next, the first and second source/drain patterns 510 and 520 may be formed on the first and second active patterns AF1 and AF2. The second gate insulating pattern 602 and the second gate pattern 612 may be formed by performing a gate replacement process and may be stacked on the oxide layer. The second liner layer 220 (e.g., second liner part 220P3) may remain on the second field isolation pattern 330 on the third regions R2 like the second liner layer 220 of the semiconductor device 6 of FIG. 14F FIG. 17 is a schematic block diagram illustrating an electronic system including a semiconductor device according to example embodiments of the inventive concepts.

Figure 17:
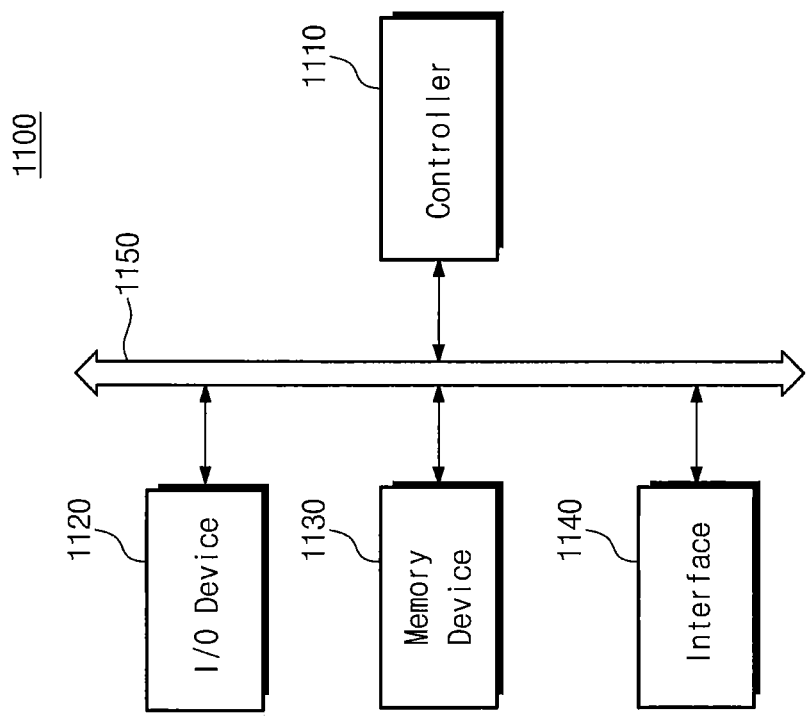
FIG. 17 is a schematic block diagram illustrating an electronic system including a semiconductor device according to example embodiments of the inventive concepts.

Referring to FIG. 17, an electronic system 1100 according to example embodiments of the inventive concepts may include a controller 1110, an input/output (I/O) unit 1120, a memory device 1130, an interfacial unit 1140, and a data bus 1150. At least two of the controller 1110, the I/O unit 1120, the memory device 1130, and the interfacial unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interfacial unit 1140 may transmit electrical data to a communication network or may receive electrical data from a communication network. The interfacial unit 1140 may operate by wireless or cable. For example, the interfacial unit 1140 may include an antenna a wireless/cable transceiver. Although not shown in the drawings, the electronic system 1100 and/or controller 1110 may further include a fast dynamic random access memory (DRAM) device and/or a fast static random access memory (SRAM) device which acts as a cache memory or a working memory for improving an operation of the controller 1110. At least one of the semiconductor devices according to the aforementioned example embodiments of the inventive concepts may be provided into the memory device 1130, the controller 1110, the working memory (or the cache memory), and/or the I/O unit 1120.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a semiconductor device, the method comprising:
    providing a substrate including an active pattern and a mask pattern sequentially stacked on the substrate, the active pattern protruding from the substrate, and the mask pattern overlapping an uppermost surface of the active pattern;
    forming a first liner layer on the substrate to cover the active pattern and the mask pattern;
    forming a field isolation insulating layer on the first liner layer;
    etching the field isolation insulating layer, the first liner layer, and the mask pattern to expose an upper portion, including the uppermost surface, of the active pattern and to form a field isolation pattern that exposes the upper portion of the active pattern and covers a lower portion of the active pattern;
    forming a second liner layer on the upper portion of the active pattern and the field isolation pattern;
    forming a dummy gate on the second liner layer and crossing the active pattern;
    forming spacer patterns on sidewalls of the dummy gate, respectively, and on the second liner layer;
    forming source/drain patterns on the active pattern adjacent the sidewalls of the dummy gate, respectively;
    etching the second liner layer which is formed on the active pattern and is not covered by the dummy gate and the spacer patterns;
    forming an interlayer insulating layer on the field isolation pattern and the active pattern on the sidewalls of the dummy gate;
    forming an opening in the interlayer insulating layer by removing the dummy gate;
    forming a gate insulating pattern in the opening; and
    forming a gate pattern on the gate insulating pattern in the opening,
    wherein the active pattern includes germanium, and the source/drain patterns have a germanium content greater than a germanium content of the active pattern, and
    wherein each of the source/drain patterns directly contacts both the second liner layer and a respective one of the spacer patterns.

2. The method of claim 1, wherein the second liner layer includes a high-k dielectric material.

3. The method of claim 1, wherein forming the opening comprises:
    exposing the second liner layer by removing the dummy gate; and
    etching the exposed second liner layer such that a portion of the second liner layer remains under one of the spacer patterns.

4. The method of claim 1, wherein forming the opening comprises exposing the second liner layer by removing the dummy gate, and wherein forming the gate insulating pattern comprises forming the gate insulating pattern on the second liner layer.

5. The method of claim 1, wherein forming the source/drain patterns comprises:
    forming epitaxial layers on the active pattern adjacent the sidewalls of the dummy gate, respectively.

6. The method of claim 5, further comprising forming an etch stop layer on the second liner layer,
    wherein forming the dummy gate comprises forming the dummy gate on the etch stop layer, and the dummy gate crosses the active pattern and the field isolation pattern,
    wherein forming the spacer patterns comprises forming the spacer patterns on the sidewalls of the dummy gate and the etch stop layer, and
    wherein etching the second liner layer comprises etching the etch stop layer and the second liner layer using the dummy gate and the spacer patterns as an etch mask.

7. A method of fabricating a semiconductor device, the method comprising:
    forming a trench in a substrate to form an active pattern;
    forming a first liner layer extending on the active pattern;
    forming a field isolation layer on the first liner layer;
    forming a field isolation pattern and a first liner pattern by etching the field isolation layer and the first liner layer, respectively, wherein etching the field isolation layer and the first liner layer comprises exposing an upper portion, including an uppermost surface, of the active pattern underlying the first liner layer and forming the first liner pattern on a lower portion of the active pattern, and wherein the upper portion of the active pattern is exposed by the field isolation pattern;
    after forming the field isolation pattern and the first liner pattern, forming a second liner pattern and a spacer pattern on the active pattern, the spacer pattern overlapping the second liner pattern;
    forming a source/drain pattern on the active pattern adjacent the spacer pattern;
    forming a gate insulating pattern on the upper portion of the active pattern; and
    forming a gate pattern on the gate insulating pattern and crossing the active pattern, the spacer pattern being on a sidewall of the gate pattern,
    wherein the second liner pattern includes a high-k dielectric material,
    wherein the second liner pattern is self-aligned with the spacer pattern, and
    wherein the source/drain pattern directly contacts both the spacer pattern and the second liner pattern and has a germanium content greater than a germanium content of the active pattern.

8. The method of claim 7, wherein forming the second liner pattern comprises:
    forming a second liner layer on the upper portion of the active pattern;
    forming a dummy gate on the second liner layer and crossing the active pattern;
    forming the spacer pattern on a sidewall of the dummy gate;
    removing a first portion of the second liner layer exposed by the dummy gate and the spacer pattern;

forming the source/drain pattern adjacent the sidewall of the dummy gate;

forming an interlayer insulating layer covering the source/drain pattern and exposing the dummy gate;

removing the dummy gate to expose a second portion of the second liner layer; and etching the second portion of the second liner layer to expose the upper portion of the active pattern such that the second liner pattern is formed under the spacer pattern.

9. The method of claim 8, wherein the gate insulating pattern is formed on the exposed upper portion of the active pattern to contact the spacer pattern and the second liner pattern.

10. The method of claim 7, further comprising forming an etch stop layer, wherein the etch stop layer is between the spacer pattern and the second liner pattern.

11. The method of claim 7,
wherein the substrate comprises a first region, a second region, and a third region,
wherein forming the trench in the substrate comprises forming a plurality of trenches in the substrate to form a first active pattern protruding from the first region and a second active pattern protruding from the second region,
wherein forming the first liner pattern comprises forming a plurality of first liner patterns in the plurality of trenches, respectively, a first one of the plurality of first liner patterns is on a side of a lower portion of the first active pattern and exposes an upper portion of the first active pattern, and a second one of the plurality of first liner patterns is on a side of a lower portion of the second active pattern and exposes an upper portion of the second active pattern,
wherein forming the field isolation pattern comprises forming a plurality of field isolation patterns in the plurality of trenches, respectively, a first one of the plurality of field isolation patterns covers the side of the lower portion of the first active pattern, and a second one of the plurality of field isolation patterns covers the side of the lower portion of the second active pattern,
wherein the second liner pattern and the spacer pattern are formed on the first active pattern, and the second liner pattern is between the spacer pattern and the first active pattern,
wherein the source/drain pattern is formed on the first active pattern adjacent the spacer pattern,
wherein the germanium content of the source/drain pattern is greater than a germanium content of the first active pattern,
wherein the method further comprises forming a second field isolation pattern on the third region, the second field isolation pattern separating the first region and the second region, and
wherein the germanium content of the first active pattern is greater than a germanium content of the second active pattern.

12. The method of claim 11, further comprising forming a third liner pattern disposed on the second field isolation pattern.

13. The method of claim 12, wherein the second liner pattern and the third liner pattern include a same material.

14. The method of claim 13, wherein the second liner pattern and the third liner pattern include a high-k dielectric material or nitride containing silicon.

15. The method of claim 11, wherein the second liner pattern is formed to be self-aligned with the spacer pattern.

16. The method of claim 11, wherein forming the gate pattern comprises forming a first gate pattern crossing the first active pattern, and the spacer pattern is on a sidewall of the first gate pattern, and
wherein the second liner pattern is formed to be disposed under the spacer pattern and the first gate pattern.

17. A method of fabricating a semiconductor device, the method comprising:
forming an active pattern and a mask pattern sequentially stacked on a substrate, the active pattern protruding from the substrate, and the mask pattern overlapping an uppermost surface of the active pattern;
forming a first liner layer on the active pattern and the mask pattern;
forming a field isolation layer on the first liner layer;
etching the field isolation layer, the first liner layer, and the mask pattern to form a field isolation pattern and a first liner pattern, respectively, and to expose an upper portion, including the uppermost surface, of the active pattern, wherein the field isolation pattern and the first liner pattern are on a side of a lower portion of the active pattern, and wherein the field isolation pattern is formed concurrently with the first liner pattern or before the first liner pattern is formed;
forming a second liner layer on the upper portion of the active pattern after forming the field isolation pattern and the first liner pattern;
forming a dummy gate on the second liner layer, the dummy gate crossing the active pattern;
forming spacer patterns on opposing sidewalls of the dummy gate, respectively, and on the second liner layer;
forming a source/drain pattern on the active pattern adjacent one of the spacer patterns; and
replacing the dummy gate with a gate pattern,
wherein the source/drain pattern is disposed on a sidewall of the second liner layer and an outer-sidewall of the one of the spacer patterns.

18. The method of claim 17, wherein replacing the dummy gate with the gate pattern comprises:
removing the dummy gate to form an opening; and
forming the gate pattern in the opening.

19. The method of claim 17, further comprising:
etching a portion of the second liner layer not covered by the dummy gate and the spacer patterns,
wherein the active pattern includes germanium, and the source/drain pattern has a germanium content greater than a germanium content of the active pattern.

20. The method of claim 17, wherein forming the second liner layer comprises forming the second liner layer to directly contact the uppermost surface of the active pattern, which is exposed by etching the field isolation layer, the first liner layer, and the mask pattern.

21. The method of claim 17, wherein both the first liner layer and the second liner layer comprise high-k dielectric material.

22. The method of claim 17, wherein the mask pattern comprises a material different from the active pattern.

* * * * *